US010987815B2

(12) United States Patent
Prahlad et al.

(10) Patent No.: US 10,987,815 B2
(45) Date of Patent: Apr. 27, 2021

(54) METHODS AND SYSTEMS FOR ELECTROADHESION-BASED MANIPULATION AND MECHANICAL RELEASE IN MANUFACTURING

(71) Applicant: GRABIT, INC., Sunnyvale, CA (US)

(72) Inventors: Harsha Prahlad, Cupertino, CA (US); Richard J. Casler, Los Gatos, CA (US); Susan Kim, Menlo Park, CA (US); Matthew Leettola, San Jose, CA (US); Jon Smith, San Jose, CA (US); Kenneth Tan, San Jose, CA (US); Patrick Wang, San Jose, CA (US); John Mathew Farren, Beaverton, OR (US); Patrick Conall Regan, Beaverton, OR (US); Po Cheng Chen, Taichung (TW); Howard Fu, Beaverton, OR (US); Honam Ko, Taichung (TW); Dragan Jurkovic, Beaverton, OR (US); Aishwarya Varadhan, Beaverton, OR (US); Tsung Tai Chien, Taichung (TW); Chang-Chu Liao, Douliu (TW); Chih-Chi Chang, Douliu (TW); Kuo-Hung Lee, Douliu (TW); Ming-Feng Jean, Douliu (TW); TaeHoun Kim, Busan (KR); Qingde Chen, San Jose, CA (US); Greg Miller, Santa Rosa, CA (US)

(73) Assignee: Grabit, Inc., Ada, MI (US)

( * ) Notice: Subject to any disclaimer, the term of this patent is extended or adjusted under 35 U.S.C. 154(b) by 176 days.

(21) Appl. No.: 16/030,497

(22) Filed: Jul. 9, 2018

(65) Prior Publication Data
US 2018/0319019 A1    Nov. 8, 2018

Related U.S. Application Data

(63) Continuation of application No. PCT/US2017/013264, filed on Jan. 12, 2017.
(Continued)

(51) Int. Cl.
*B25J 15/00* (2006.01)
*B25J 15/06* (2006.01)
(Continued)

(52) U.S. Cl.
CPC ......... *B25J 15/0085* (2013.01); *B23P 19/007* (2013.01); *B25J 9/0093* (2013.01);
(Continued)

(58) Field of Classification Search
CPC .............. H01L 21/6831; H01L 21/6833; B25J 15/0052; B25J 15/0085; B25J 15/065;
(Continued)

(56) References Cited

U.S. PATENT DOCUMENTS 3,480,174 A    11/1969   Sherwood et al.
3,797,691 A     3/1974   Williams et al.
(Continued)

FOREIGN PATENT DOCUMENTS

CN    203889500 U    10/2014
CN    203911809 U    10/2014
(Continued)

OTHER PUBLICATIONS

U.S. Appl. No. 15/105,941 Office Action dated Jun. 28, 2019.
(Continued)

*Primary Examiner* — Dean J Kramer
(74) *Attorney, Agent, or Firm* — Gardner, Linn, Burkhart & Ondersma LLP

(57) ABSTRACT

Systems, apparatus, and methods of manufacturing an article using electroadhesion technology, either as a sole modality
(Continued)

of handling such materials or in concert with at least one mechanically actuated modality for the pick-up and release of materials, respectively. The mechanically actuated modality in one embodiment is configured as a netting configured to be placed over a contact surface of an electroadhesive plate to facilitate the handling of an object.

20 Claims, 18 Drawing Sheets

Related U.S. Application Data

(60) Provisional application No. 62/277,756, filed on Jan. 12, 2016.

(51) Int. Cl.
| | | |
|---|---|---|
| *H02N 13/00* | (2006.01) | |
| *B25J 9/00* | (2006.01) | |
| *B25J 19/02* | (2006.01) | |
| *B25J 9/16* | (2006.01) | |
| *H05K 13/02* | (2006.01) | |
| *H05K 13/04* | (2006.01) | |
| *B23P 19/00* | (2006.01) | |
| *B32B 37/18* | (2006.01) | |
| *A43D 111/00* | (2006.01) | |
| *B23P 21/00* | (2006.01) | |
| *H01L 21/683* | (2006.01) | |
| *B32B 38/18* | (2006.01) | |

(52) U.S. Cl.
CPC ........... *B25J 9/0096* (2013.01); *B25J 9/1697* (2013.01); *B25J 15/0052* (2013.01); *B25J 15/065* (2013.01); *B25J 15/0616* (2013.01); *B25J 15/0666* (2013.01); *B25J 19/023* (2013.01); *B32B 37/18* (2013.01); *H02N 13/00* (2013.01); *H05K 13/021* (2013.01); *H05K 13/0408* (2013.01); *A43D 111/003* (2013.01); *B23P 21/00* (2013.01); *B32B 2038/1891* (2013.01); *B32B 2309/70* (2013.01); *H01L 21/6831* (2013.01); *H01L 21/6833* (2013.01)

(58) Field of Classification Search
CPC .. B25J 15/0666; B25J 15/0616; B25J 9/0093; B25J 9/0096; H02N 13/00; H05K 13/0408; B23P 19/007
USPC .................................................. 294/186, 187
See application file for complete search history.

(56) References Cited

U.S. PATENT DOCUMENTS

| | | |
|---|---|---|
| 4,723,353 A | 2/1988 | Monforte |
| 4,856,769 A | 8/1989 | Andrew et al. |
| 5,207,313 A | 5/1993 | Gebhardt |
| 5,532,903 A | 7/1996 | Kendall |
| 5,765,707 A | 6/1998 | Kenevan |
| 5,883,357 A | 3/1999 | Newman et al. |
| 6,123,185 A | 9/2000 | Demarest et al. |
| 6,548,982 B1 | 4/2003 | Papanikolopoulos et al. |
| 6,622,063 B1 | 9/2003 | Moritz et al. |
| 6,721,762 B1 | 4/2004 | Levine et al. |
| 7,034,432 B1 | 4/2006 | Pelrine et al. |
| 7,598,651 B2 | 10/2009 | Kornbluh et al. |
| 9,987,755 B2 | 6/2018 | Prahlad et al. |
| 2001/0045755 A1 | 11/2001 | Schick et al. |
| 2004/0045963 A1 | 3/2004 | Hoogland |
| 2004/0146380 A1 | 7/2004 | Baker et al. |
| 2004/0162639 A1 | 8/2004 | Watanabe et al. |
| 2005/0036873 A1 | 2/2005 | Ikehata et al. |
| 2007/0005180 A1 | 1/2007 | Stingel, III et al. |
| 2007/0271857 A1 | 11/2007 | Heather et al. |
| 2008/0089002 A1 | 4/2008 | Pelrine et al. |
| 2008/0100983 A1* | 5/2008 | Purohit ............... H01L 21/6831 361/234 |
| 2010/0018964 A1 | 1/2010 | Smith |
| 2010/0147842 A1 | 6/2010 | Reynard et al. |
| 2010/0178139 A1 | 7/2010 | Sundar et al. |
| 2010/0194012 A1* | 8/2010 | Tatsumi ............... B65G 49/061 269/21 |
| 2010/0249553 A1 | 9/2010 | Maclaughlin |
| 2011/0193362 A1 | 8/2011 | Prahlad et al. |
| 2011/0202157 A1 | 8/2011 | Spikker |
| 2012/0024740 A1 | 2/2012 | Gollnick et al. |
| 2012/0101627 A1 | 4/2012 | Lert |
| 2012/0120544 A1 | 5/2012 | Pelrine et al. |
| 2012/0181270 A1 | 7/2012 | Smith |
| 2012/0330453 A1 | 12/2012 | Samak et al. |
| 2013/0010398 A1 | 1/2013 | Prahlad et al. |
| 2013/0125319 A1 | 5/2013 | Regan |
| 2013/0129464 A1 | 5/2013 | Regan et al. |
| 2013/0147129 A1* | 6/2013 | Chiu ................... H01L 21/6831 279/3 |
| 2013/0149485 A1 | 6/2013 | Furukawa et al. |
| 2013/0242455 A1 | 9/2013 | Prahlad et al. |
| 2013/0276826 A1 | 10/2013 | Koenig et al. |
| 2013/0292303 A1 | 11/2013 | Prahlad et al. |
| 2013/0294875 A1 | 11/2013 | Prahlad et al. |
| 2014/0008359 A1 | 1/2014 | Ferren |
| 2014/0036404 A1 | 2/2014 | Prahlad et al. |
| 2014/0104744 A1 | 4/2014 | Prahlad et al. |
| 2014/0241844 A1 | 8/2014 | Golda et al. |
| 2015/0036259 A1* | 2/2015 | Cox ................... H01L 21/6833 361/234 |
| 2015/0176981 A1 | 6/2015 | Regan et al. |
| 2015/0295206 A1 | 10/2015 | Hsieh |
| 2015/0298320 A1 | 10/2015 | Eisele et al. |
| 2015/0314583 A1 | 11/2015 | Jess et al. |
| 2016/0318190 A1 | 11/2016 | Prahlad et al. |
| 2017/0036798 A1 | 2/2017 | Prahlad et al. |
| 2018/0250832 A1 | 9/2018 | Prahlad et al. |
| 2018/0319020 A1 | 11/2018 | Prahlad et al. |
| 2018/0326596 A1 | 11/2018 | Prahlad et al. |

FOREIGN PATENT DOCUMENTS

| | | |
|---|---|---|
| CN | 203990927 U | 12/2014 |
| CN | 104718609 A | 6/2015 |
| DE | 102009011302 A1 | 9/2010 |
| DE | 102011051585 A1 | 1/2013 |
| DE | 102013220107 A1 | 4/2015 |
| EP | 1473764 A2 | 11/2004 |
| JP | S58104806 A | 6/1983 |
| JP | H0539885 U | 5/1993 |
| JP | H07116984 A | 5/1995 |
| JP | H09269995 A | 10/1997 |
| JP | 2000286543 A | 10/2000 |
| JP | 2003285289 A | 10/2003 |
| JP | 2004142878 A | 5/2004 |
| JP | 2005035751 A | 2/2005 |
| JP | 2007222967 A | 9/2007 |
| JP | 2009166859 A | 7/2009 |
| JP | 2012131612 A | 7/2012 |
| JP | 2013037538 A | 2/2013 |
| KR | 20110078566 A | 7/2011 |
| KR | 20130130405 A | 12/2013 |
| WO | WO-2007128398 A1 | 11/2007 |
| WO | WO-2013166317 A2 | 11/2013 |
| WO | WO-2013166324 A2 | 11/2013 |
| WO | WO-2015094375 A1 | 6/2015 |
| WO | WO-2015095826 A1 | 6/2015 |
| WO | WO-2015142754 A1 | 9/2015 |
| WO | WO-2015142911 A1 | 9/2015 |
| WO | WO-2015164264 A1 | 10/2015 |
| WO | WO-2016054561 A1 | 4/2016 |
| WO | WO-2017123816 A1 | 7/2017 |

(56) References Cited

FOREIGN PATENT DOCUMENTS

| WO | WO-2017123817 A1 | 7/2017 |
|---|---|---|
| WO | WO-2017123818 A1 | 7/2017 |
| WO | WO-2018071722 A1 | 4/2018 |

OTHER PUBLICATIONS

PCT/US2013/077280 International Preliminary Report on Patentability dated Jun. 30, 2016.
PCT/US2013/077280 International Search Report and Written Opinion dated Oct. 2, 2014.
PCT/US2014/071725 International Preliminary Report on Patentability dated Jun. 30, 2016.
PCT/US2014/071725 International Search Report and Written Opinion dated Apr. 16, 2015.
PCT/US2015/020805 International Preliminary Report on Patentability dated Sep. 29, 2016.
PCT/US2015/020805 International Search Report and Written Opinion dated Jul. 20, 2015.
PCT/US2015/021051 International Preliminary Report on Patentability dated Sep. 29, 2016.
PCT/US2015/021051 International Search Report and Written Opinion dated Sep. 3, 2015.
PCT/US2015/026679 International Preliminary Report on Patentability dated Nov. 3, 2016.
PCT/US2015/026679 International Search Report and Written Opinion dated Aug. 27, 2015.
PCT/US2017/013262 International Preliminary Report on Patentability dated Jul. 26, 2018.
PCT/US2017/013262 International Search Report and Written Opinion dated May 24, 2017.
PCT/US2017/013262 Invitation to Pay Additional Fees dated Mar. 20, 2017.
PCT/US2017/013264 International Preliminary Report on Patentability dated Jul. 26, 2018.
PCT/US2017/013264 International Search Report and Written Opinion dated May 16, 2017.
PCT/US2017/013266 International Search Report and Written Opinion dated Apr. 3, 2017.
PCT/US2017/056413 International Search Report and Written Opinion dated Jan. 12, 2018.
U.S. Appl. No. 15/126,709 Office Action dated Jul. 11, 2017.
U.S. Appl. No. 15/105,941 Office Action dated Sep. 21, 2018.
U.S. Appl. No. 15/299,984 Office Action dated Aug. 21, 2019.

* cited by examiner

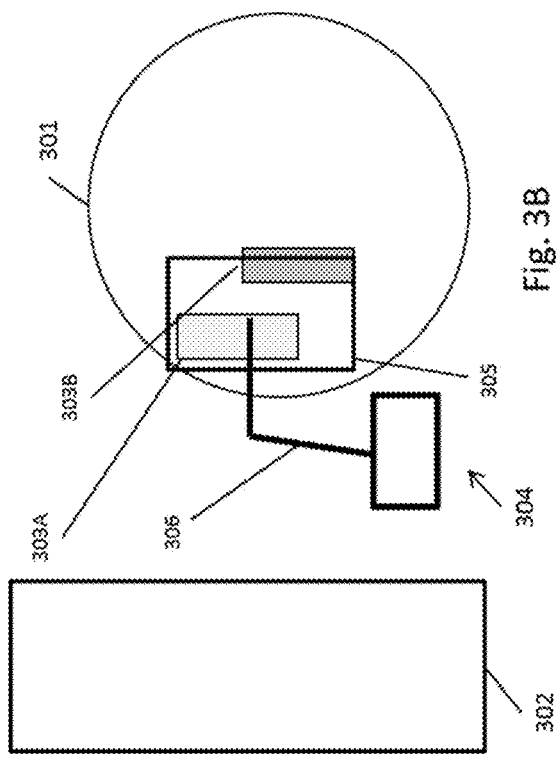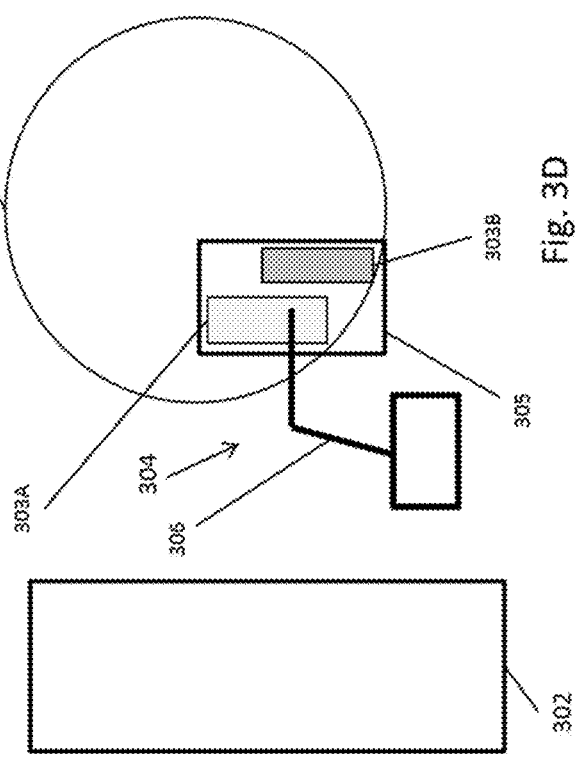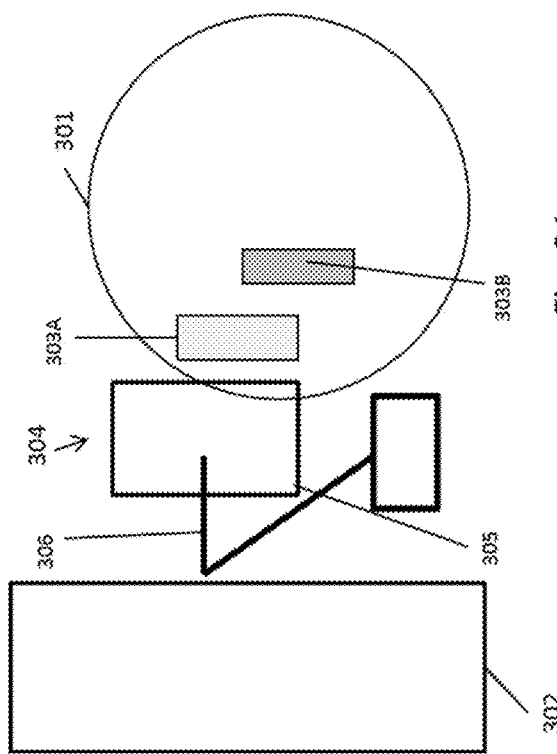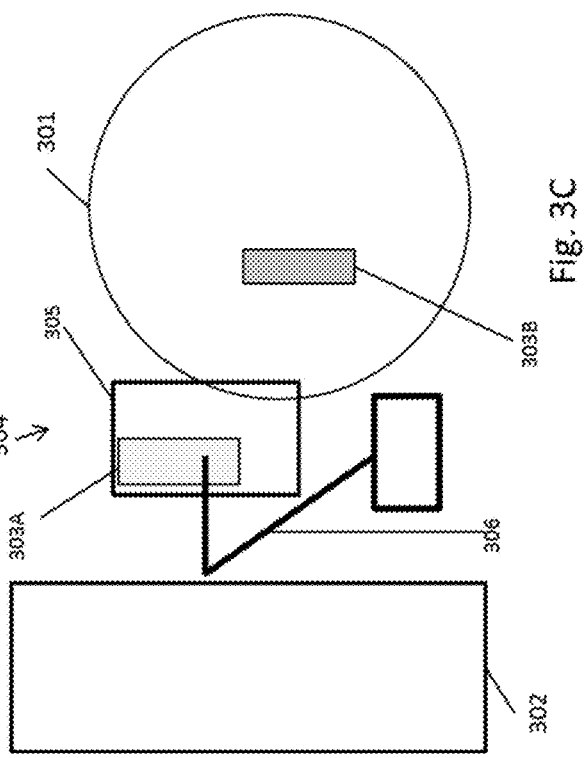

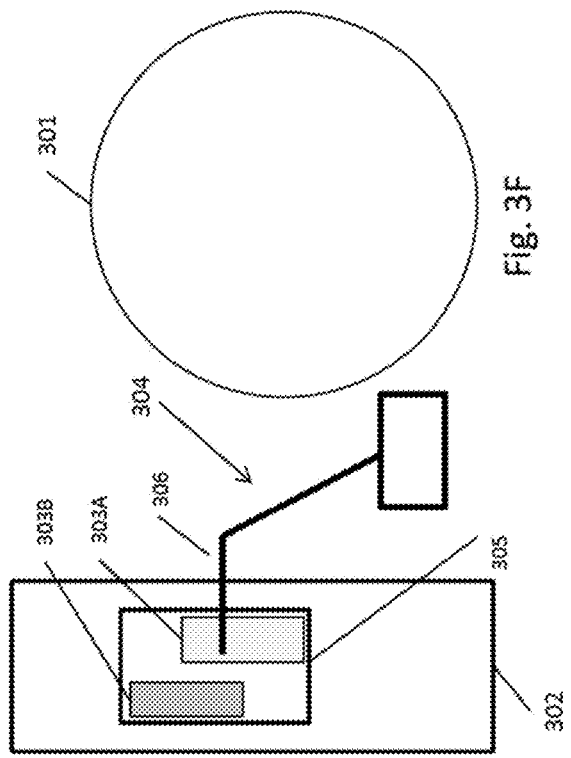
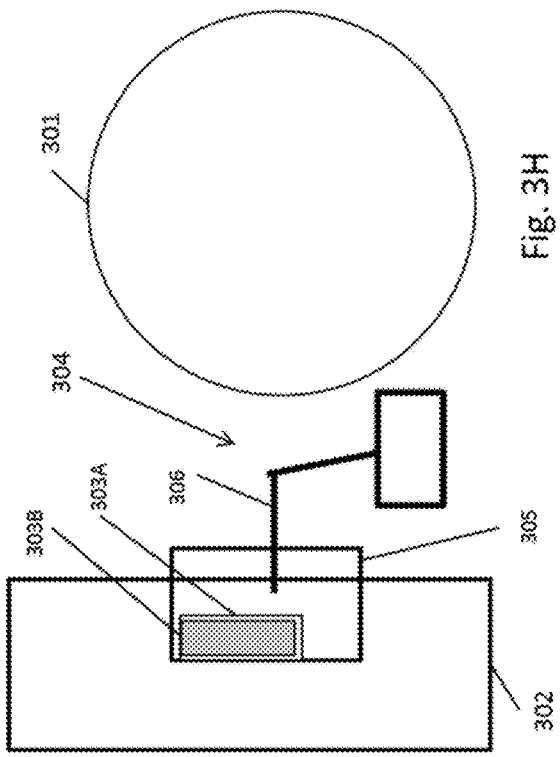
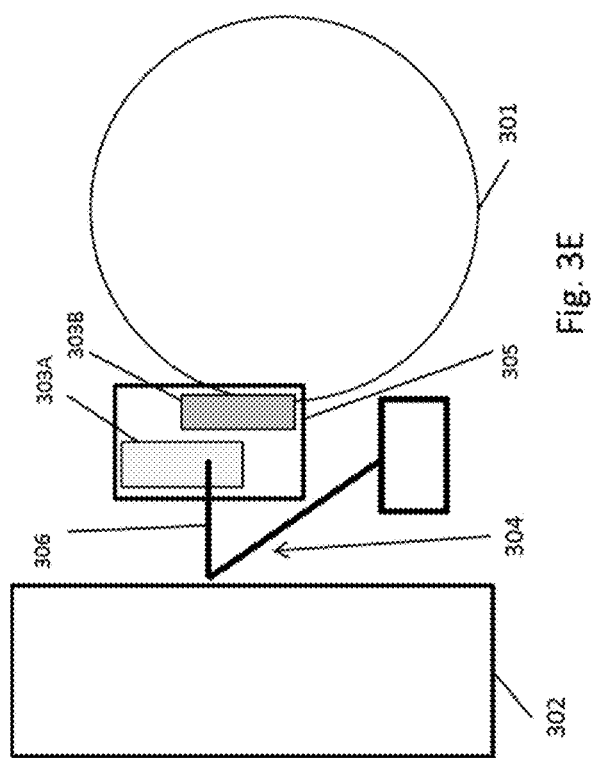
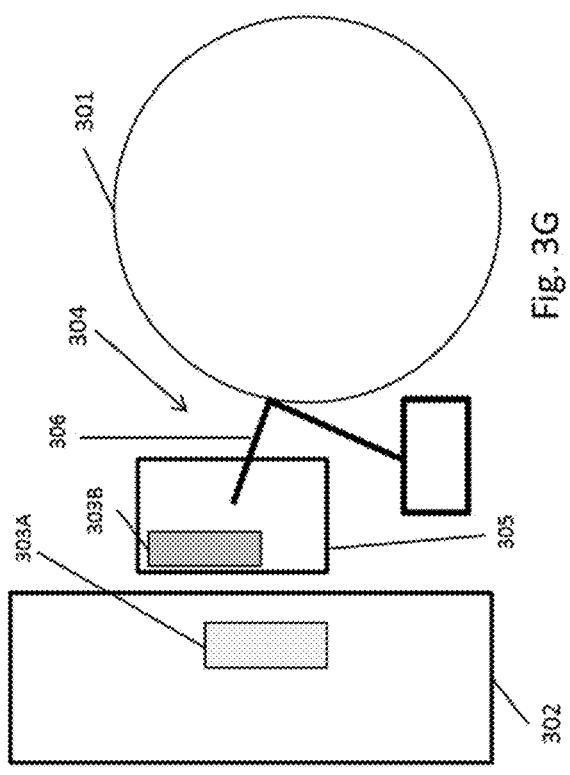

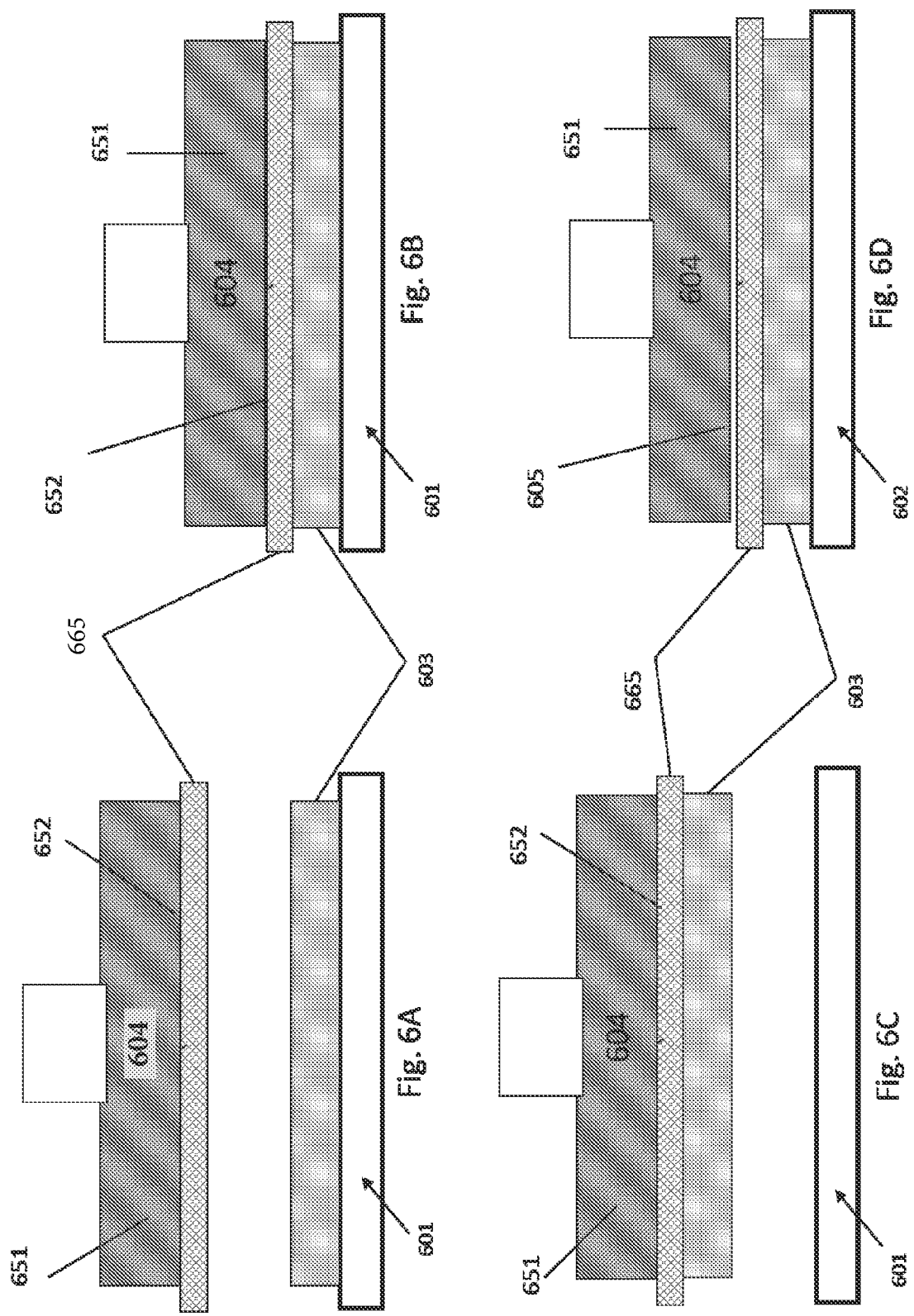

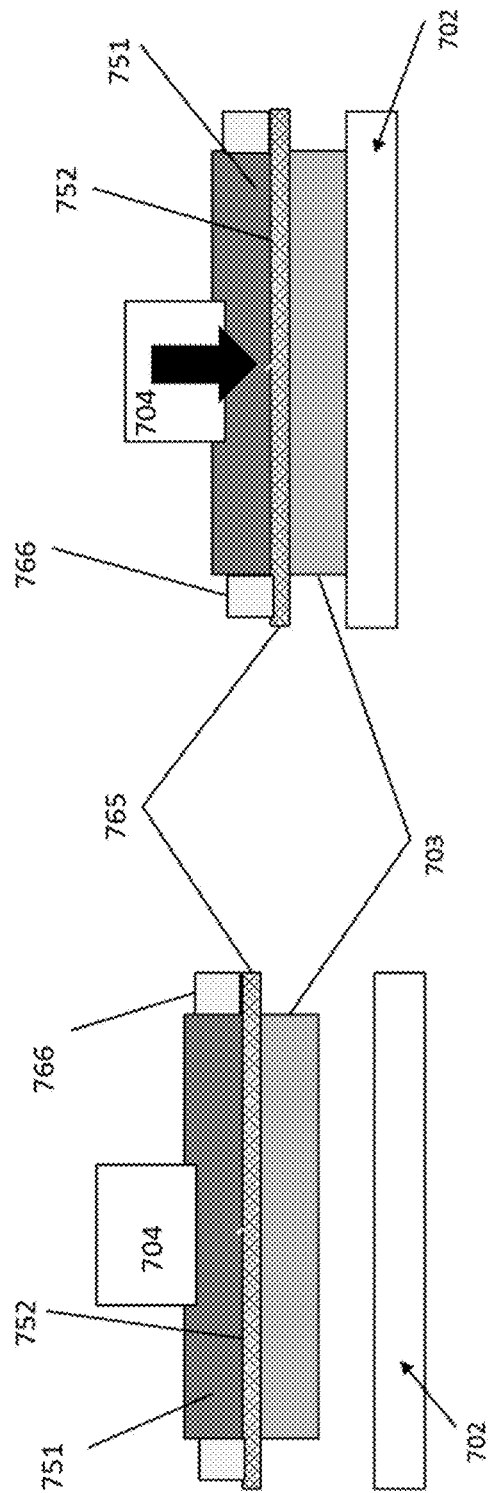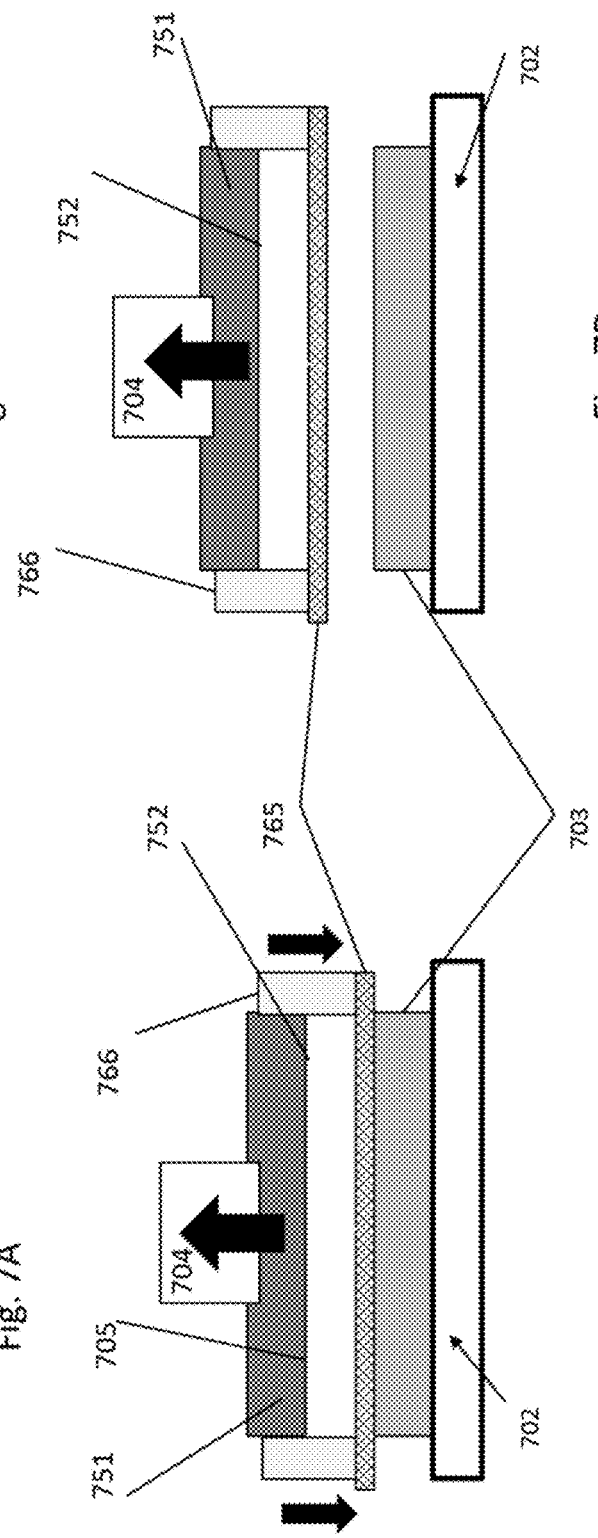

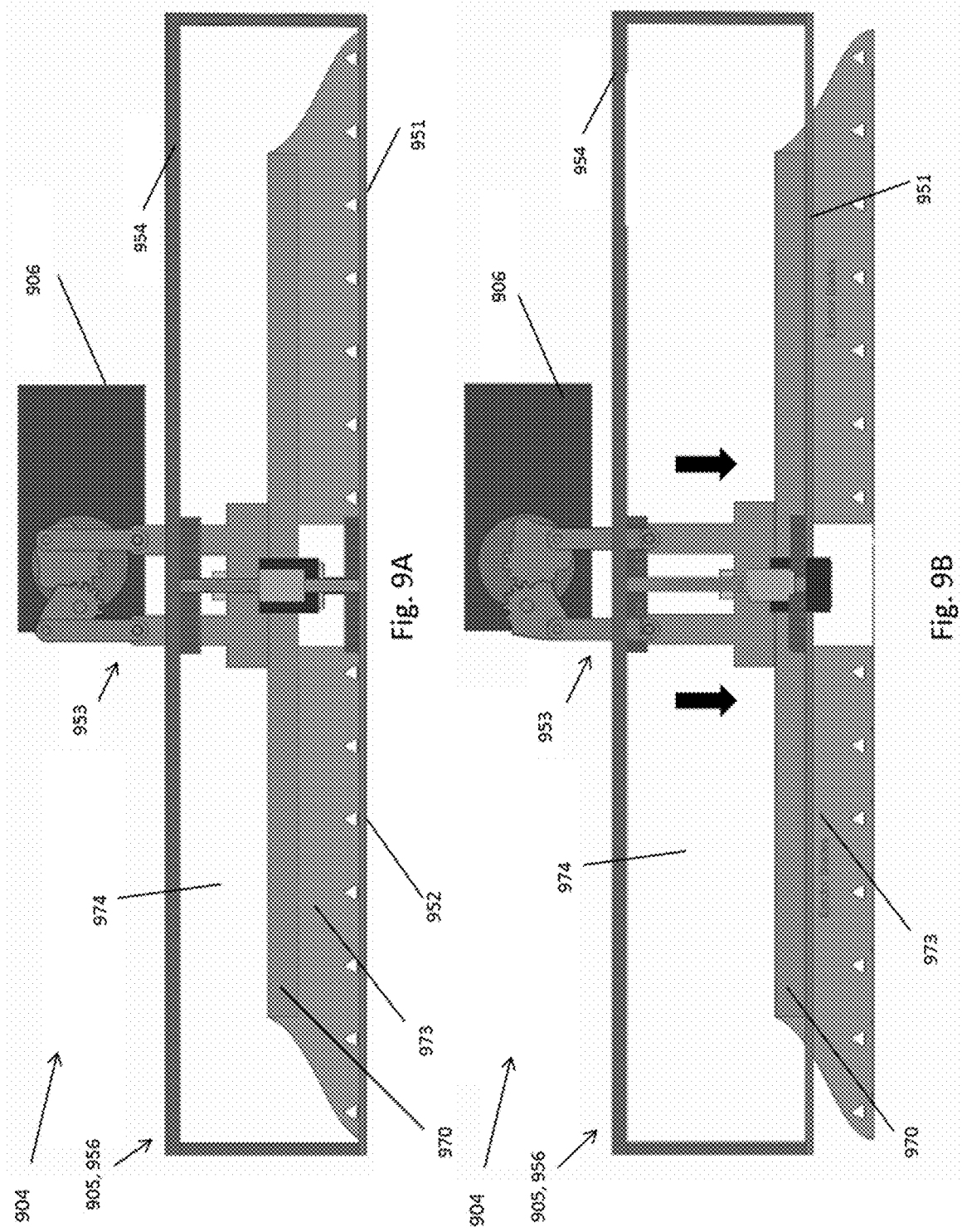

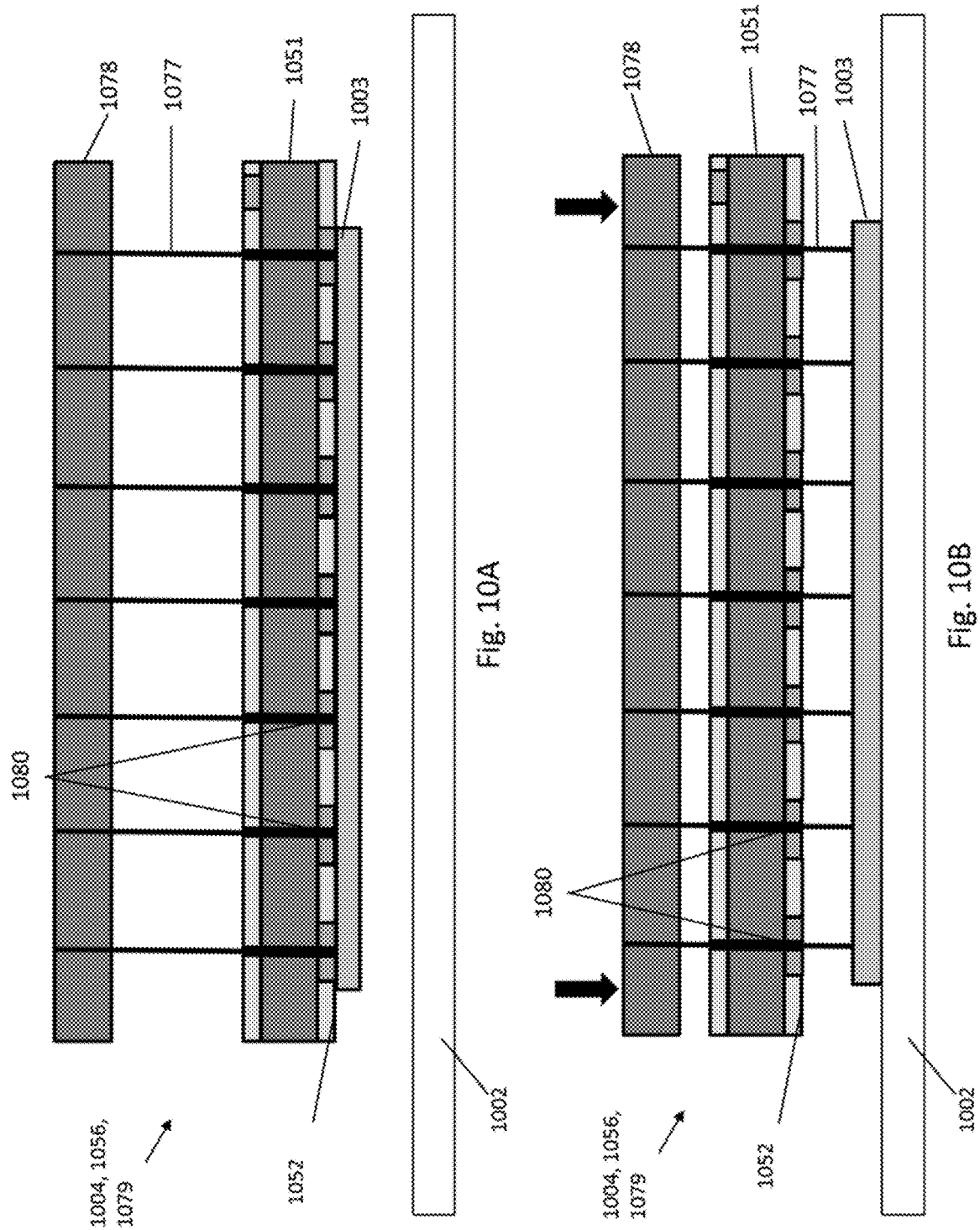

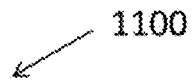

Step 1101: Capture 1st article component with 1st zone and 2nd article component with 2nd zone
    1101A: Activate electroadhesion
    1101B: Apply negative pressure
Step 1102: Release 1st article component; retain 2nd article component
    1102A: Reverse electrode voltage
    1102B: Separate netting
    1102C: Extend pins
    1102D: Cease negative pressure
    1102E: Apply positive pressure
Step 1103: Release 2nd article
Step 1104: Repeat for multiple article components

Fig. 11

Step 1201: Place capture element over 1st article component
       1201A: Move robot arm
       1201B: Align capture element to 1st pre-determined capture location
Step 1202: Capture 1st article component with 1st zone
       1202A: Activate electroadhesion
       1202B: Apply negative pressure
Step 1203: Place capture element over 2nd article component
       1203A: Move robot arm
       1203B: Align capture element to 2nd pre-determined capture location
Step 1204: Capture 2nd article component with 2nd zone
       1204A: Activate electroadhesion
       1204B: Apply negative pressure
Step 1205: Move article components over 2nd platform
       1205A: Move robot arm
       1205B: Align capture element to 1st pre-determined release location
Step 1206: Release 1st article component; retain 2nd article component
       1206A: Reverse electrode voltage
       1206B: Separate netting
       1206C: Extend pins
       1206D: Cease negative pressure
       1206E: Apply positive pressure
Step 1207: Release 2nd article component
Step 1208: Repeat for multiple article components

Fig. 12

METHODS AND SYSTEMS FOR ELECTROADHESION-BASED MANIPULATION AND MECHANICAL RELEASE IN MANUFACTURING

CROSS-REFERENCE

This application is a continuation of International Application No. PCT/US2017/013264, filed on Jan. 12, 2017, entitled "METHODS AND SYSTEMS FOR ELECTROADHESION-BASED MANIPULATION AND MECHANICAL RELEASE IN MANUFACTURING" [Attorney Docket No. 42462-707.602], which claims the benefit of U.S. Provisional Application No. 62/277,756, filed Jan. 12, 2016, entitled "Methods and Systems for Electroadhesion-Based Manipulation in Manufacturing", the entire contents of which are herein incorporated by reference.

BACKGROUND OF THE INVENTION

The mass production of products has led to many innovations over the years. Substantial developments have been made in the industrial handling of various materials and items, particularly in the area of robotics. For example, various types of robotics and other automated systems are now used in order to "pick and place" items during many manufacturing and other materials handling processes. Such robotics and other systems can include robot arms that, for example, grip, lift and/or place an item as part of a designated process. Of course, other manipulations and materials handling techniques can also be accomplished by way of such robotics or other automated systems.

SUMMARY OF THE INVENTION

Despite many advances over the years in this field, there are limitations as to what can be handled in such a robotic or automated manner.

Conventional robotic grippers typically use either suction or a combination of large normal and shear forces and fine control with mechanical actuation in order to grip objects. Such techniques have several drawbacks. For example, the use of suction tends to require smooth, clean, dry, non-porous, and generally flat surfaces, which limits the types and conditions of objects that are gripped. Suction also tends to require a lot of power for the pumps and is prone to leaks at any location on a vacuum or low pressure seal, with a resulting loss of suction being potentially catastrophic. The use of mechanical actuation often requires large normal or "crushing" forces against an object, and also tends to limit the ability to robotically grip flexible, deformable, fragile, or delicate objects. Producing large forces also increases the cost of mechanical actuation. Mechanical pumps and conventional mechanical actuation with large crushing forces also often require substantial weight, which is a major disadvantage for some applications, such as the end of a robot arm where added mass must be supported. Furthermore, even when used with sturdy objects, robotic arms, mechanical claws and the like can still leave damaging marks on the surface of the object itself.

Alternative techniques for handling items and materials also have drawbacks. For example, chemical adhesives can leave residues and tend to attract dust and other debris that reduce effectiveness. Chemical adhesives can also require a significant amount of added force to undo or overcome a grip or attachment to an object once such a chemical adhesive grip or attachment is applied, since the gripping interaction and force is typically not reversible in such instances.

Conventional robotic grippers often do not support gripping of more than one object at a time and thus limit the speed with which operations including a plurality of objects are completed. Conventional systems are also often constrained by a requirement that said objects be fed to the robotic gripper with precise orientations by a human operator for proper "pick and place". Furthermore, conventional systems are typically large and require special fencing to protect operators from the hazards of working near high-speed robots.

Although many systems and techniques for handling materials in an automated fashion for the manufacture of an article have generally worked well in the past, there is a desire to provide alternative and improved ways of handling items. In particular, improved automated systems, devices, and techniques are needed to enable the picking and placing or other handling of a plurality of materials including a broad spectrum of flexible and/or porous materials of various shapes and sizes that cannot be handled reliably using conventional vacuum and mechanical methods. Such materials include but are not limited to woven and knit fabric, as used in athletic footwear and apparel manufacturing, carbon fiber sheets, as used in airframe manufacture, and flexible printed circuit boards. The ability to pick up flexible materials without distorting their shape through sagging, wrinkling, or other deformation, and then place them precisely in such a way that preserves their shape is desired so as to enable automation of a variety of subsequent tasks such as welding, fusing, stitching, bonding, printing, or any other task that requires precise placement of flexible materials.

Provided herein are apparatus and methods of manufacturing an article using electroadhesion technology in concert with at least one mechanically actuated modality for the acquisition and release of materials, respectively.

Provided herein is an electroadhesive apparatus. An exemplary electroadhesive apparatus comprises an electroadhesive plate having a contact surface for capturing one or more target objects with electroadhesion and a controller configured to individually activate or deactivate electroadhesion of the electroadhesive plate. The electroadhesive plate comprises a mechanical separation mechanism. The controller is configured to actuate the mechanical separation mechanism independent of activation or deactivation of electroadhesion. In some embodiments, the electroadhesive plate comprises a plurality of electroadhesive zones. Electroadhesion in each electroadhesive zone is separately activated and the controller is configured to individually activate or deactivate electroadhesion in each of the plurality of electroadhesive zones. In some embodiments, the electroadhesive plate comprises a plurality of ports thereon, the plurality of ports configured to apply negative pressure to facilitate capture of the one or more target objects and coupled to one or more negative pressure sources. The plurality of ports optionally comprises a plurality of port regions, with each port region configured to be separately actuated and complementary to each of the plurality of electroadhesive zones to facilitate selective capture or release of the one or more target objects from the electroadhesive zone. In some embodiments, the mechanical mechanism includes a frame coupled to thin filaments (also referred to herein as netting) that leave a substantial portion of the capture element surface exposed. In some embodiments, the mechanical mechanism comprises of an array of pins that project out of the surface of the capture element through a set of holes in said surface when desired, but are otherwise withdrawn away from the capture element surface to aid in capture of the article components. In many embodiments, the plurality of electroadhesive zones comprises a first zone for capturing a first target objet and a second zone for capturing a second target object. In many embodiments, the first and second zones are optionally separately activated to selectively capture or release one or more of the first and second article components. In many embodiments, the first and second zones are concurrently activated to capture or release the one or more target objects. In many embodiments, the first and second zones are sequentially activated to capture or release the one or more target objects. The first and second zones are separately mechanically actuated to capture or release one or more of the first and second article components. Electroadhesion in each electroadhesive zone is separately activated. In some embodiments, the electroadhesive zones are coplanar. In some embodiments, the electroadhesive zones are not coplanar but instead are arranged in the approximate form of a curved surface or in a disjoint set of planes. In some embodiments, the electroadhesive surface is coupled to an actuator or a passive linear movement mechanism such that the surfaces are sometimes coplanar and other times on parallel but separate planes. In some embodiments, two or more of the electroadhesive zones are coplanar. In some embodiments, two or more of the electroadhesive zones are non-planar. In some embodiments, one or more of the electroadhesive zones is compressible. In some embodiments, the controller is coupled to each of the electroadhesive zones to individually activate electroadhesion in each of the electroadhesive zones. In some embodiments, the same or a different controller is configured to individually activate, modulate the magnitude of, or deactivate the mechanical release mechanism. The controller is optionally configured to actuate the mechanical separation mechanism independent of activation or deactivation of electroadhesion. Alternatively or in combination, the mechanical separation mechanism comprises a netting or a set of filaments configured to be placed over or inlaid into the contact surface to facilitate capture or release of the one or more captured target objects. The netting, for example, is configured to separate from the contact surface to facilitate release of the one or more captured target objects. Optionally, at least a portion of the netting is inlaid into the contact surface. In some embodiments, the apparatus optionally further comprises a linear actuator coupled to the electroadhesive plate and the netting to separate the netting and the contact surface from one another to facilitate release of the one or more captured target objects. In some embodiments, electroadhesion remains activated while the netting is separated from the contact surface. In some embodiments, electroadhesion is deactivated while the netting is separated from the contact surface. Alternatively or in combination, the netting comprises a plurality of netting regions, wherein each netting region is configured to be separately actuated and complementary to each separately activated electroadhesive zone to facilitate release of the captured one or more target objects from the electroadhesive zone. In some embodiments, the plurality of netting regions comprises a first netting region and a second netting region, the first netting region having a higher density netting than the second netting region. In some embodiments, the linear actuator is force-controlled such that it is activated to apply downward pressure onto the target object once the target object is placed in physical contact with the predetermined release location. Release is accomplished by moving the robotic actuator vertically from the predetermined release location thereby enabling the force-controlled linear actuator to extend from its retracted position and release the object. Alternatively or in combination, the mechanical separation mechanism comprises an array of pins extendable from the contact surface to facilitate release of the one or more captured target objects. The plurality of pins for example optionally comprises a plurality of pin regions, wherein each pin region is configured to be separately actuated and complementary to each separately activated electroadhesive zone to facilitate release of the captured one or more target objects from the electroadhesive zone. The apparatus optionally further comprises a robotic actuator coupled to the electroadhesive plate to move the electroadhesive plate to capture or release the one or more target objects. In some embodiments, the robotic actuator is configured to position the electroadhesive plate to sequentially capture or release the first and second target objects. Sequentially capturing the first and second target objects optionally comprises positioning the robotic actuator so that the first target object is aligned with a first predetermined capture location on the electroadhesive plate, capturing the first target object on the first predetermined capture location, repositioning the robotic actuator so that the second target object is aligned with a second predetermined capture location on the electroadhesive plate, and capturing the second target object on the second predetermined capture location. The robotic actuator is optionally configured to position the electroadhesive plate to simultaneously capture or release the first and second target objects. The robotic actuator is optionally configured to move the electroadhesive plate to sequentially or simultaneously position the captured first and second target objects over first and second predetermined release locations, respectively. In many embodiments, the robotic actuator comprises a robotic arm. In some embodiments, one or more of the target objects comprises a textile piece, a shoe part, an automotive part, a machinery part, or a circuitry part, and wherein the article comprises, respectively, at least a portion of an article of clothing, at least a portion of a shoe, at least a portion of a machine, or at least a portion of a circuit.

Provided herein are methods of capturing and releasing a plurality of target objects. An exemplary method comprises the steps of capturing a first target object with an electroadhesive plate, capturing a second target object with the electroadhesive plate, releasing the first target object from the electroadhesive plate, and releasing the second target object from the electroadhesive plate. One or more of releasing the first and second target objects comprises mechanically separating the one or more of the first and second target objects from a contact surface of the electroadhesive plate. In many embodiments, capturing the first target object comprises capturing the first target object with a first electroadhesive zone of the electroadhesive plate and capturing the second target object comprises capturing the second target object with a second electroadhesive zone of the electroadhesive plate, the first and second electroadhesive zones being in separate positions. In some embodiments, releasing the first target object comprises releasing the first target object from the first electroadhesive zone while the second target object remains captured by the second electroadhesive zone, and releasing the second target object comprises releasing the second target object from the second electroadhesive zone. In many embodiments, one or more of the step of releasing the captured first article component and releasing the second article component comprises a step electrode voltage reversal. Alternatively or in combination, one or more of the steps of releasing the captured first article component and releasing the second article component comprises a step of applying an electrode voltage reversal pulse. Some embodiments further comprise the step of applying negative pressure to facilitate capture of one or more of the first and second target objects. The negative pressure is optionally applied from a plurality of ports in the electroadhesive plate. In many embodiments, mechanically separating the first and second target objects comprises separating a netting from a contact surface of the electroadhesive plate. In some embodiments, at least a portion of the netting is inlaid into the contact surface. In some embodiments, the netting for example optionally comprises a first netting zone and a second netting zone, the first and second netting zones being separately translated to release the first and second target objects. Alternatively or in combination, the step of mechanically separating the first and second target objects comprises extending a plurality of pins from a contact surface of the electroadhesive plate to separate the contact surface from the captured one or more of the first and second target objects. The plurality of pins for example optionally comprises a first pin region and a second pin region. The step of releasing the first target object optionally comprises a step of extending the first pin region from the first electroadhesive zone and the step of releasing the second target object comprises a step of extending the second pin region from the second electroadhesive zone. The pins optionally extend in a direction transverse to the contact surface, for example. In some embodiments, the pins extend in a direction perpendicular to the contact surface. In many embodiments, the first and second electroadhesive zones are separately activated to capture or release one or more of the first and second target objects. The first and second zone are concurrently activated or sequentially activated. One or more of releasing the captured first target object and releasing the second target object optionally comprises selectively releasing one or more of the first and second target objects from the electroadhesion. In some embodiments, one or more of capturing the first target object and capturing the second target object comprises moving a robotic actuator to position the electroadhesive plate. In some embodiments, at least the first and second target objects are assembled into an article. In many embodiments, the robotic actuator comprises a robotic arm. In some embodiments, one or more of the target objects comprises a textile piece, a shoe part, an automotive part, a machinery part, or a circuitry part, and wherein the article comprises, respectively, at least a portion of an article of clothing, at least a portion of a shoe, at least a portion of a machine, or at least a portion of a circuit.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIGS. 3A-3H illustrate an embodiment of an electroadhesion manufacturing system in use;

FIG. 3A shows a schematic of the electroadhesion manufacturing system prior with a first and a second article component on a first platform;

FIGS. 3B-3C show schematics of the electroadhesion gripper picking up a first article component but not yet a second article component (i.e., the electroadhesive gripper picks up the article components or parts sequentially, though the electroadhesive gripper can pick up the article components or parts simultaneously as well);

FIGS. 3D-3E show schematics of the electroadhesion gripper picking up the second article component;

FIG. 3F shows a schematic of the system after the electroadhesion gripper has been moved above the second platform;

FIG. 3G shows a schematic of the release of the first article component onto the second platform while the second article component is retained on the electroadhesion gripper;

FIG. 3H shows a schematic of the release of the second article component;

FIG. 4A shows an embodiment of an electroadhesion gripper with a single electroadhesion zone;

FIG. 4B shows a top view of the embodiment of FIG. 4A;

FIG. 4C shows an exemplary embodiment of an electroadhesion gripper with multiple electroadhesion zones for selective capture and release of article components;

FIGS. 6A-6D and 7A-7E show schematics of embodiments of an electroadhesion gripper comprising netting to aid in release of article components from the gripper;

FIGS. 6A-6D illustrate an embodiment of an electroadhesion gripper with netting where the netting supports passive ejection of an article component;

FIGS. 6A-6C show the capture of an article component;

FIG. 6D shows the release of the article component;

FIGS. 7A-7E illustrate another embodiment of an electroadhesion gripper with netting wherein the netting is displaced from the surface of the electroadhesion gripper plate for active release of an article component from the gripper;

FIGS. 9A-9B show schematics of an embodiment of an electroadhesion gripper comprising a mechanical separation mechanism to facilitate capture and release of an article component;

FIG. 9A shows a cross-section of an embodiment of an electroadhesion gripper comprising, a mechanical separation mechanism with mechanical separation mechanism retracted;

FIG. 9B shows a cross-section of an embodiment of an electroadhesion gripper comprising a mechanical separation mechanism with mechanical separation mechanism extended;

FIGS. 10A-10B illustrate schematics of an embodiment of an electroadhesion gripper comprising pins to aid in release of an article component from the electroadhesion gripper;

FIG. 10A shows an electroadhesion gripper with captured article component and an array of retracted pins;

FIG. 10B shows the release of the article component by actuation of the pins through the electroadhesion gripper plate towards the second platform;

FIG. 11 shows a flowchart of a method capturing and releasing a plurality of target objects; and FIG. 12 shows a flowchart of a method of manufacturing an article.

DETAILED DESCRIPTION OF THE INVENTION

Figure 1A:
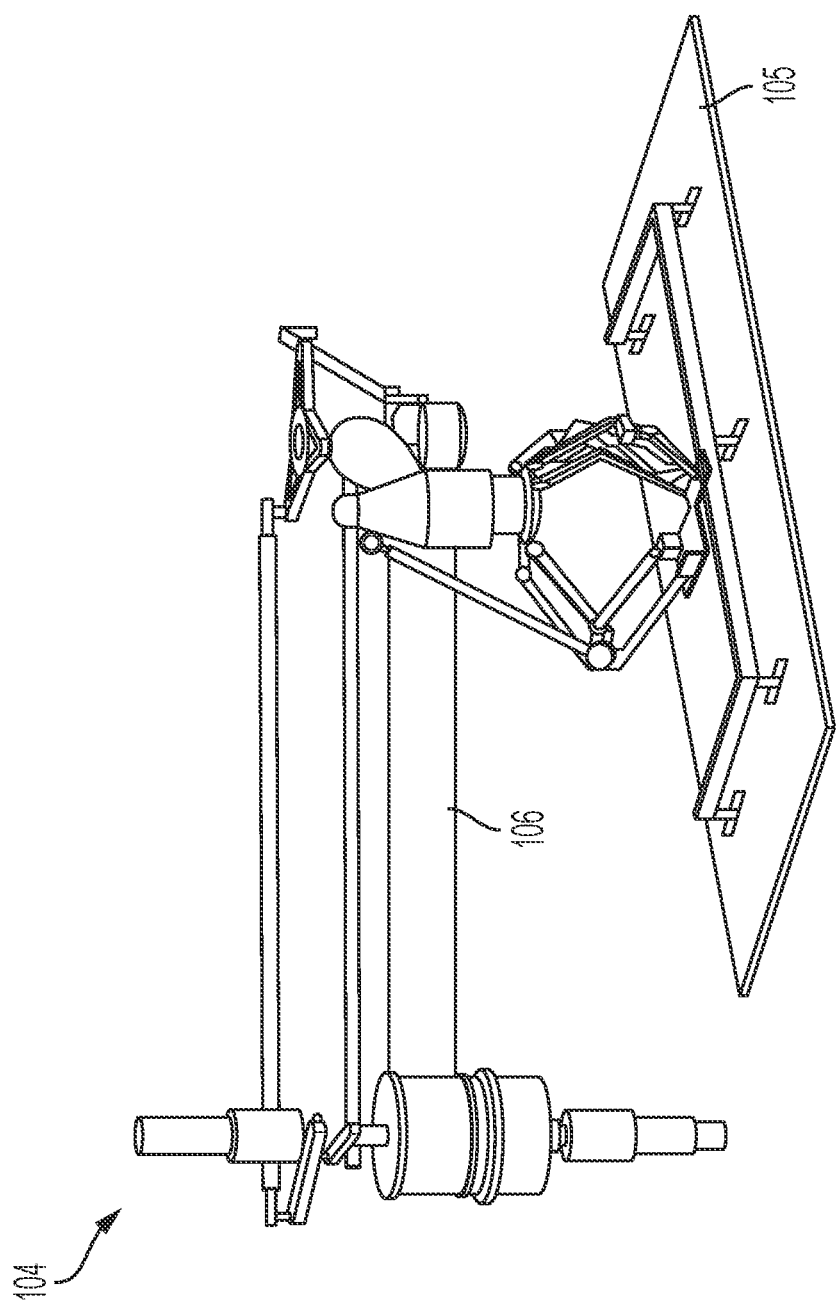
FIG. 1A shows an embodiment of a robotic actuator that embodies a multi-zone electroadhesion gripper.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

As the term is used herein, "electroadhesion" refers to the mechanical coupling of two objects using electrostatic forces. Electroadhesion as described herein uses electrical control of these electrostatic forces to permit temporary and detachable attachment between a foreign substrate, for example an article component, and a pick-up surface of an electroadhesion-enabled capture element. This electrostatic adhesion holds the foreign substrate and the pick-up surface together via an electrostatic attraction normal to the surface and increases traction or friction between the foreign substrate and the surface of the capture element due to electrostatic forces created by an applied electric field. The surface of the capture element is placed against or nearby a surface of a foreign substrate. An electrostatic adhesion voltage is then applied to the electrodes using (integrated) control electronics in electrical communication with the electrodes. The electrostatic adhesion voltage comprises unipolar or bipolar operation. In some embodiments, the electrostatic adhesion voltage uses alternating positive or negative charges and ground on neighboring electrodes. In some embodiments, the electrostatic adhesion voltage uses alternating positive and negative charges on neighboring electrodes. In some embodiments, the electrostatic adhesion voltage uses positive and negative charges alternating with ground on neighboring electrodes. As a result of the voltage difference between electrodes, one or more electroadhesive forces are generated, which electroadhesive forces act to hold the surface of the capture element and the foreign substrate against one another. Due to the nature of the forces being applied, it will be readily appreciated that actual contact between the surface of the capture element and the foreign substrate is not necessary. For example, in many embodiments a piece of paper, thin film, netting, or other material or substrate is placed between the pick-up surface of the capture element and the foreign substrate. In many embodiments, there is no other material or substrate between the pick-up surface of the capture element and the foreign substrate. The electrostatic force maintains the current position of the pick-up surface of the capture element relative to the surface of the foreign substrate. The overall electrostatic force is sufficient to overcome the gravitational pull on the foreign substrate, such that the capture element is used to hold the foreign substrate aloft.

The electrostatic adhesion force between the pick-up surface of the capture element and the surface of the foreign substrate diminishes over time (typically 50-100 msec) after the electrode voltage is driven to zero, for example by a high-voltage supply. Thus, the capture element is able to move readily relative to the surface of the foreign substrate. This condition allows the capture element to move before and after an electrostatic adhesion voltage is applied. Well-controlled electrical activation and de-activation enables fast adhesion and detachment. Because the electrode impedance is largely capacitive, the quiescent power supplied to the capture element electrode is small—typically less than 200 mW.

The capture element comprises a mechanical release/ejection mechanism. In some instances, for example when picking up certain materials, the adhesion force between the pick-up surface of the capture element and the surface of the foreign substrate diminishes more slowly over time. The geometry of the foreign substrate and/or the placement or patterning of the capture element electrodes may cause the foreign substrate to peel away from the electrode surfaces so as to make the placement position unpredictable. In such cases, having a uniform mechanical ejection mechanism to apply deterministic and uniform motion to the foreign substrate helps to ensure deterministic release and high placement accuracy of the foreign substrate. Alternatively or in combination, the mechanical release/ejection mechanism can prevent the surface of the capture element from contacting the surface onto which the foreign substrate is being placed, thereby reducing the chance of disturbance of other materials on the surface which may have been placed there previously.

It is desirable to provide for picking, placing, or other handling of materials which are light weight and/or tacky or sticky with precision. In some instances, the use of electroadhesion in combination with mechanical ejection provides improved pick and place precision for materials which may be prone to retention (in whole or in part) on the capture element. The mechanical ejection methods and apparatus described herein may be combined with any pick and place capture element known to one of ordinary skill in the art in order to facilitate release of the captured material from the capture element.

Figure 1B:
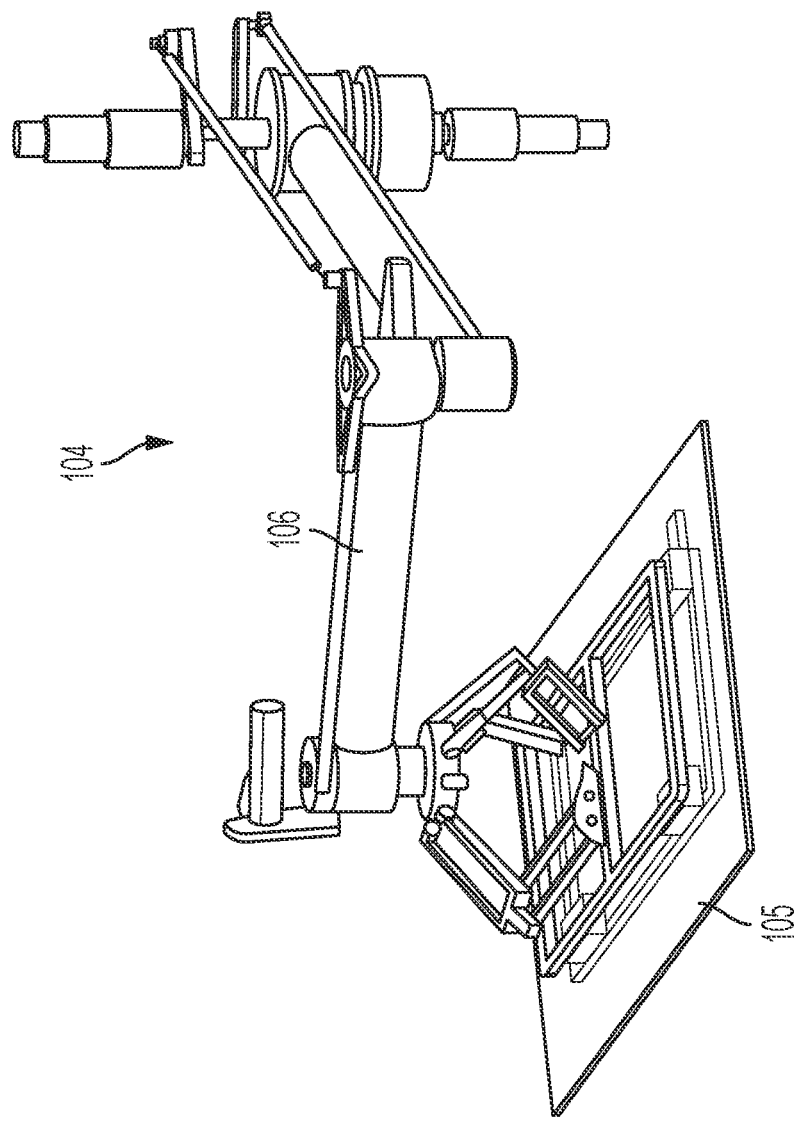
FIG. 1B shows a 180° rotated view of the electroadhesion gripper of FIG. 1A.

FIGS. 1A-1B illustrate 180° rotated views of an embodiment of an electroadhesion gripper 104 comprising a robotic actuator 106 and an electroadhesion capture element 105. The robotic actuator 106, for example, optionally comprises a robotic arm operatively coupled to the capture element 105 such that movement of the robotic arm 106 moves the capture element 105. The capture element 105 comprises an electroadhesion surface or plate.

Figure 2:
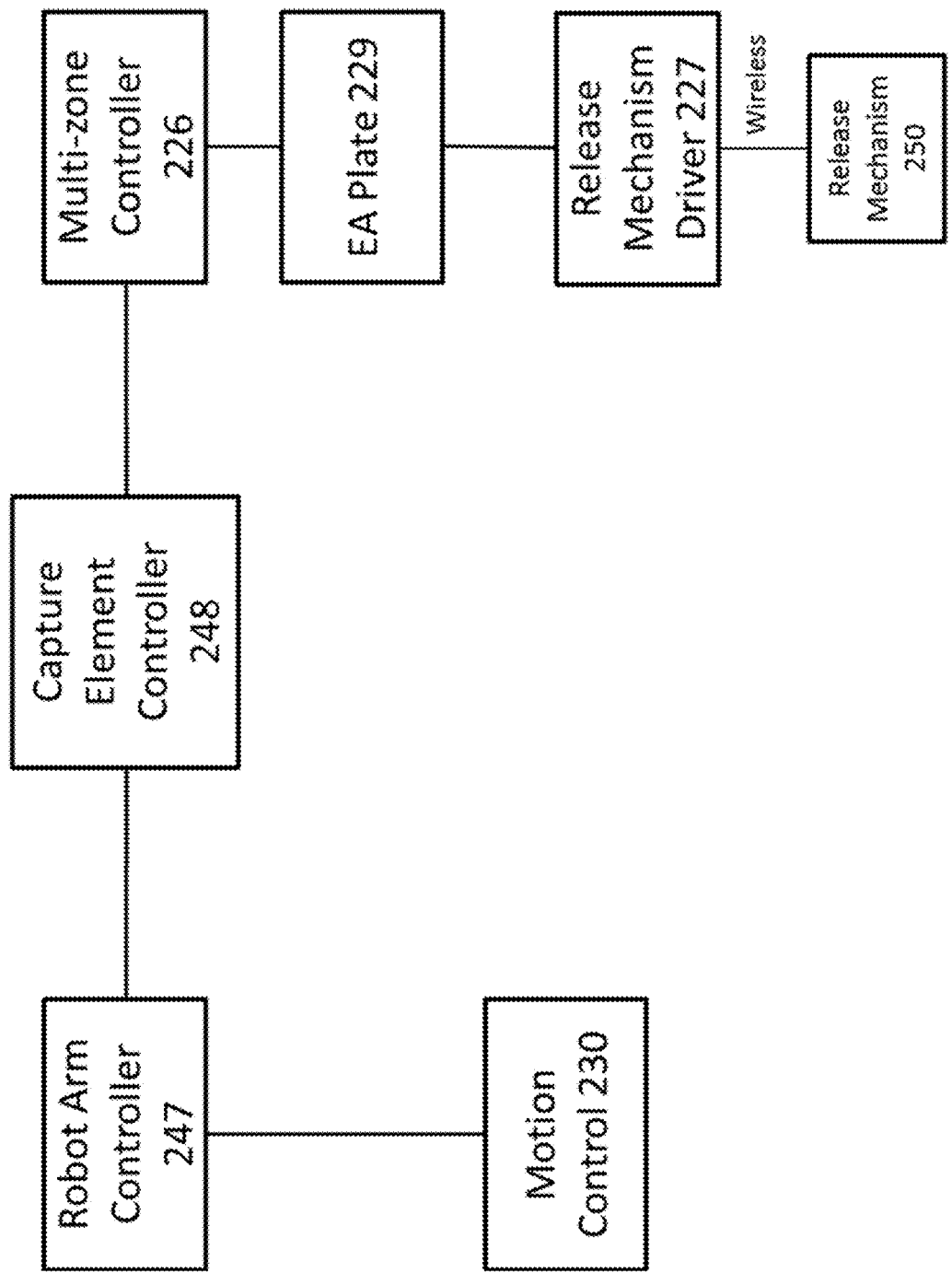
FIG. 2 shows a schematic diagram of an embodiment of an electroadhesion gripper.

FIG. 2 shows a box diagram of an embodiment of an electroadhesion gripper apparatus. The electroadhesion gripper comprises a robotic actuator and a capture element, for example an electroadhesion surface or plate. The electroadhesion plate optionally further comprises one or more individually controllable zones of the electroadhesion. The electroadhesion plate for example comprises a single electroadhesion zone. Alternatively, the electroadhesion plate comprises two electroadhesion zones. It will be understood by one skilled in the art that the electroadhesion plate comprises as many electroadhesion zones as required for the manufacture of an article from a plurality of article components. In some embodiments, the electroadhesion zones are separable from one another such that the electroadhesion plate has replaceable segments or zones.

The electroadhesion gripper comprises a capture element controller 248 in communication with the robotic actuator controller 247 comprising systems for motion control 230 as previously described herein. The capture element controller 248 is optionally in communication with the multi-zone controller system 226. The multi-zone controller system 226 individually controls the actuation of the electroadhesion zones in some embodiments. The multi-zone controller 226 is further in communication with a release driver mechanism 227 operatively connected to a release mechanism 250 to facilitate release of the captured article component from the electroadhesion zone. The release mechanism 250 for example optionally comprises one or more of a netting, an array of pins, and a combination thereof. The release driver mechanism 227 for example comprises a force-controlled actuator incorporated with an array of netting filaments or an array of pins which has the ability to separate an article component from the surface of the electroadhesion plate 229.

FIGS. 3A-3H illustrate an embodiment of an electroadhesion manufacturing system in action. The electroadhesion system comprises a first platform 301, an electroadhesion gripper 304 comprising a robotic actuator 306 coupled to a capture element 305, and a second platform 302. The robotic actuator 306 for example optionally comprises a robotic arm. The capture element 305 for example optionally comprises an electroadhesion surface or plate. The electroadhesion surface 305 optionally further comprises one or more individually actuating electroadhesion zones, for example a first electroadhesion zone and a second electroadhesion zone. The system is substantially similar to any of the embodiments described herein.

FIG. 3A shows the electroadhesion manufacturing system after a first 303A and a second article component 303B on a first platform 301 have been delivered to the robot-side from the operator-side at which the article components 303A, 303B are placed by a user. FIG. 3B shows the electroadhesion gripper 304 moving to capture the first article component 303A. In some embodiments, the system for example precisely positions the gripper 304 so as to capture the first article component 303A from the first predetermined capture location. Capture of the first article component 303A optionally further comprises activating the first electroadhesion zone but not the second electroadhesion zone. FIG. 3C shows the electroadhesion gripper 304 selectively picking up the first article component 303A but not the second article component 303B. FIG. 3D shows the electroadhesion gripper 304 moving to capture the second article component 303B. The system for example precisely positions the gripper 304 so as to capture the second article component 303B from the second predetermined capture location. Capture of the second article component 303B optionally further comprises activating the second electroadhesion zone while maintaining activation of the first electroadhesion zone so as to have both the first and the second article components 303A, 303B captured by the gripper 304 simultaneously as shown in FIG. 3E. FIG. 3F shows the system after the electroadhesion gripper 304 has moved the first and second article components 303A, 303B to a position above the second platform 302. The system for example optionally positions the robotic actuator 306 so that the first article component 303A is precisely placed over the first predetermined release location. The gripper 304 releases the first article component 303A by deactivating the first electroadhesion zone while maintaining activation of the second electroadhesion zone so as to selectively release the first article component 303A but not the second article component 303B. FIG. 3G shows the release of the first article component 303A onto the second platform 302 while the second article component 303B is retained on the electroadhesion gripper 304. FIG. 3H shows the release of the second article component 303B onto the second platform 302. The system for example positions the robotic actuator 306 so that the second article component 303B is precisely placed over the second predetermined release location. The gripper 304 optionally releases the second article component 303B by deactivating the second electroadhesion zone to form at least a portion of an assembled article.

In many embodiments, the first and second article components 303A, 303B are placed at the first and second predetermined capture locations such that the gripper 304 simultaneously captures the first and the second article components 303A, 303B by simultaneously activating both of the first and the second electroadhesion zones.

In some embodiments, the first and second article components 303A, 303B are roughly placed at the first and second predetermined capture locations, respectively, by the user. A vision system (not shown) coupled to the electroadhesion manufacturing system (e.g. in communication with the gripper 304, robotic actuator 306, controller(s), or other components of the system) is used to determine the actual positions of the first and second article components 303A, 303B. The gripper 304 captures the first and second article components 303A, 303B and the system uses the determined positions and the predetermined release locations (relative to other article components) to inform their placement on the first and second predetermined release locations, respectively. Release is aided by the mechanical ejection/release mechanism described herein. In some instances, mechanical ejection occurs prior to, simultaneously with, or after cessation of electroadhesion and/or reversal of the electrode voltage as described herein. Mechanical ejection and electroadhesion activation/deactivation can be done in concert with movement or positioning of the gripper 304 by the robotic actuator 306. This may further be combined with the application (or cessation) of positive or negative pressure as described herein.

Figure 4A:
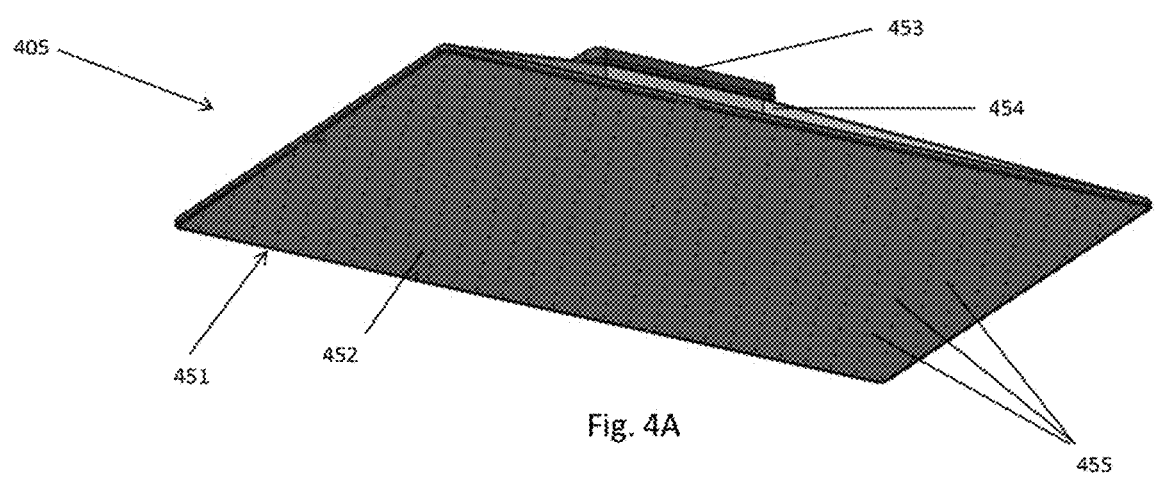
FIGS. 4A-4C illustrate perspective views of various embodiments of an electroadhesion gripper.
Figure 4B:
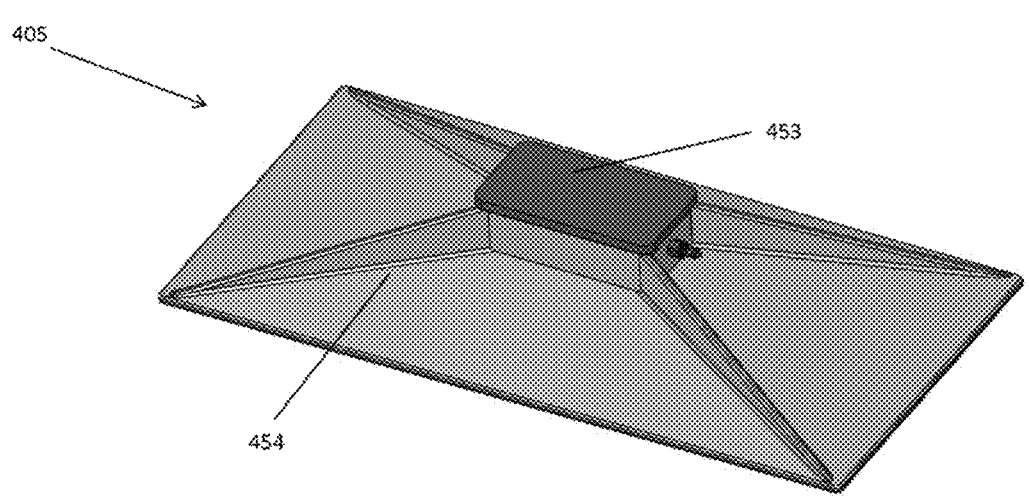
Figure 4C:
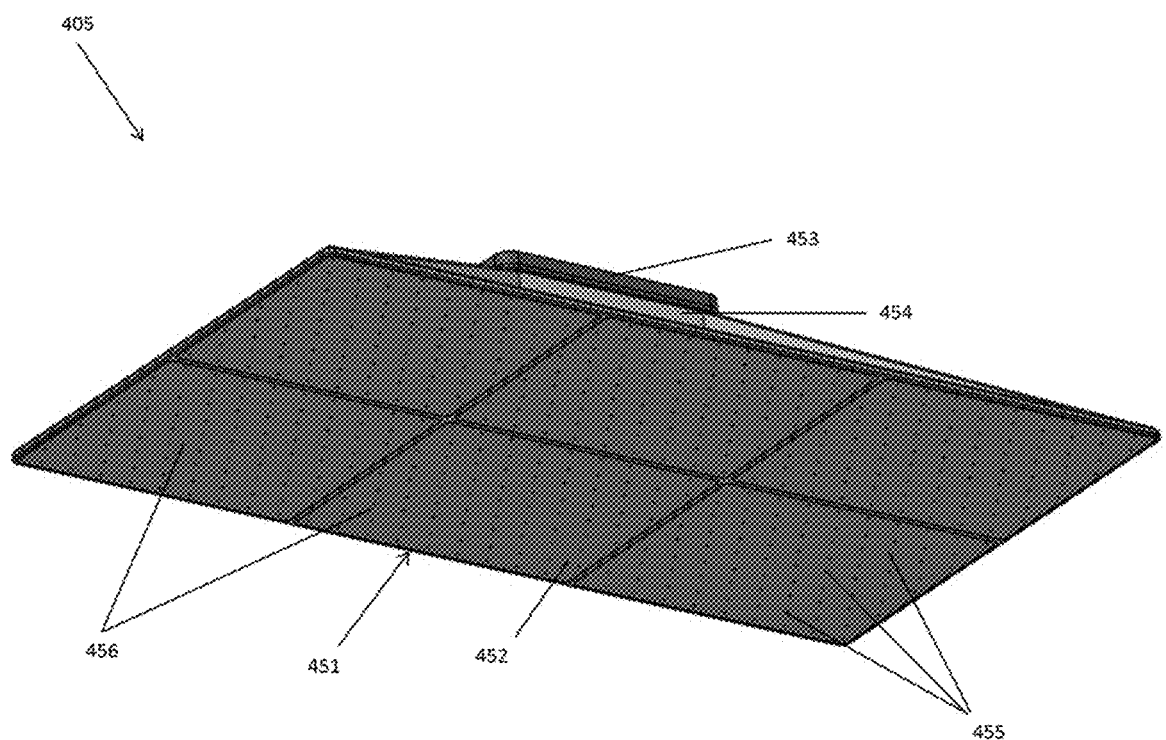

FIGS. 4A-4C illustrate various embodiments of an electroadhesion gripper. The electroadhesion gripper apparatus 405 comprises an electroadhesive plate 451 having a contact surface 452 for capturing one or more target objects (also referred to herein as article components) with electroadhesion, the electroadhesive plate 451 comprising a one or more electroadhesive zones 456, wherein electroadhesion in each electroadhesive zone 456 is separately activated and a controller (as described further herein) configured to individually activate or deactivate electroadhesion in each of the electroadhesive zones 456. FIG. 4A shows an embodiment of an electroadhesion gripper with a single electroadhesion zone 456. The electroadhesion plate 451 comprises a plurality of electrodes 455 and is operatively attached to the robotic actuator. FIG. 4B shows a top view of the embodiment of FIG. 4A highlighting the housing 454 and connection to the robotic actuator 453. FIG. 4C shows an exemplary embodiment of an electroadhesion gripper with multiple electroadhesion zones 456 for selective capture and release of multiple article components. In many embodiments, this multi-zone implementation enables a single-pick of a plurality of article components off of the first platform followed by multiple individuated placements of each article component onto the second platform. The multi-zone implementation thereby reduces the number of motion segments needed to complete the assembled article when compared to accomplishing the assembly with a single-zone gripper. For example, the electroadhesion plate 451 comprises six (6) electroadhesion zones 456 as depicted herein. It will be understood however that the capture element 405 comprises any number of electroadhesion zones 456 depending on the manufacturing requirements of the article assembly.

Figure 5:
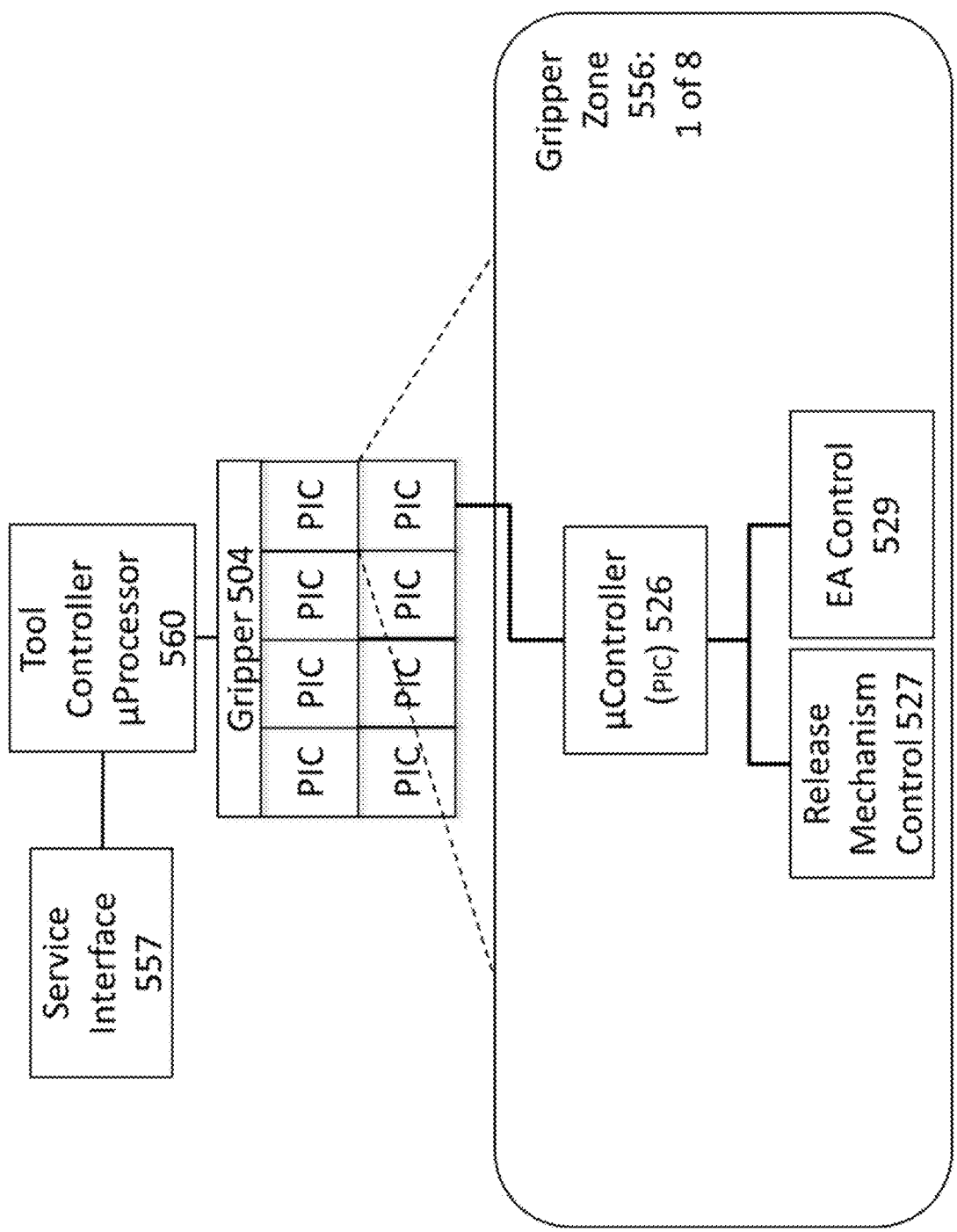
FIG. 5 shows a schematic diagram of an embodiment of an electroadhesion gripper with multiple electroadhesion zones.

FIG. 5 shows a schematic diagram of an embodiment of an electroadhesion gripper 504 with multiple electroadhesion zones 556. A tool controller microprocessor 560 (also referred to herein as a Tool Controller), for example a multi-zone controller, is in communication with a master controller, for example a service interface 557. A service interface 557 on the controller wirelessly receives data from the Tool Controller 560. The Tool Controller 560 is further in communication with the various components of each electroadhesion zone 556 on the electroadhesion gripper 504. The electroadhesion gripper 504 for example comprises a 2×4 rectangular array of eight (8) electroadhesion zones 556. Each electroadhesion zone 556 is further controlled by a dedicated microcontroller 526 in communication with one or more of the electroadhesion actuation control 529 and release mechanism control 527. The communication between the microcontroller 526 and the tool controller 560 for example is wireless.

The electroadhesive zone 556 for example optionally comprises a consumable cartridge that snaps into the multi-zone tool controller receptacle. A microcontroller 526, for example a PIC microcontroller from Microchip, in each zone 556 controls the electrode voltage.

FIGS. 6A-6D and 7A-7E show embodiments of an electroadhesion gripper 604, 704 comprising netting 665, 765 to aid in release of article components 603, 703 from the gripper 604, 704. In some embodiments, the electroadhesion gripper 604, 704 comprises a netting 665, 765 configured to be placed over a contact surface of the gripper 604, 704, or embedded in channels therein, to facilitate release of one or more captured article components 603, 703. The contact surface for example optionally comprises an electroadhesion plate 651, 751.

FIGS. 6A-6D illustrate an embodiment of an electroadhesion gripper 604 with netting 665 where the netting 665 supports passive ejection of an article component 603. The netting 665 comprises a non-conductive plastic insulator such that a static charge is generated on its outermost surface when the electroadhesive plate 651 is actuated to capture the article component 603. The polarity of the electrodes is reversed in order to facilitate release of the captured article component 603. The speed with which the polarity of the electrodes is reversed does not give the netting 665 time to discharge, therefore the netting 665 is repulsed by the like charge on the electroadhesion plate 651. The netting 665 is thus repulsed away from the gripper 604. Repulsion of the net 665, combined with gravity, carries the article component 603 with it and thus facilitates release of the article component 603 from the gripper 604. FIGS. 6A-6C show an exemplary embodiment of the capture of an article component 603 using an electroadhesion gripper 604 comprising a netting 665. FIG. 6D shows the release of the article component 603.

In some embodiments, for example as a sole modality or used in combination with other passive or active release techniques, vibration of the netting 665 supports passive ejection of the article component 603 by temporarily causing the netting 665 to separate from the gripper 604. Vibration at the resonant frequency of the netting 665 may be particularly useful in separating the netting 665 from the gripper 604, though other frequencies may be used to attain separation as desired. Alternatively or in combination, a sudden deceleration, or any other method known to one of ordinary skill in the art, may cause the netting 665 to temporarily separation from the surface of the gripper 604. The temporary separation of the netting 665, combined with gravity, carries the article component 603 with it and thus facilitates release of the article component 603 from the gripper 604.

Figure 7E:
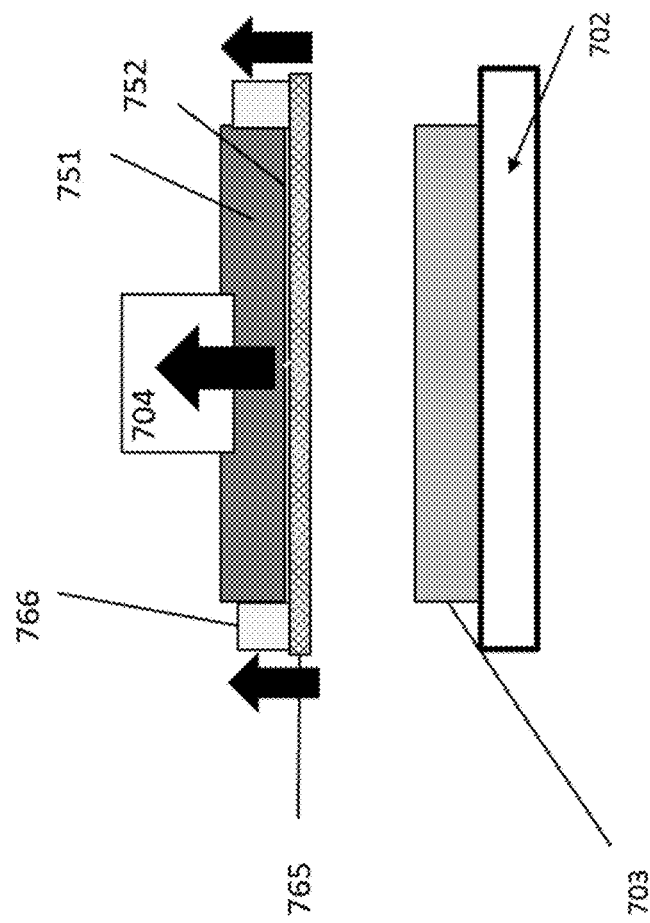

FIGS. 7A-7E illustrate another embodiment of an electroadhesion gripper 704 with netting 765 wherein the netting 765 is extended away from the electroadhesion gripper plate surface 752 for active release of an article component 703 from the gripper 704. The electroadhesion gripper 704 comprises a netting 765 configured to be placed over the contact surface 752 of an electroadhesion surface or plate 751 to facilitate release of the one or more captured target objects 703. The netting 765 for example is configured to separate from the contact surface 752 to facilitate release of the one or more captured target objects 703. The gripper 704 optionally further comprises a linear actuator 766 coupled to the electroadhesive plate 751 and the netting 765 to separate the netting 765 and the contact surface 752 from one another. FIG. 7A shows a gripper 704 with captured article component 703. FIG. 7B shows the gripper 704 with captured article component 703 placed on the second platform 702 of the electroadhesion manufacturing system by downward movement of the gripper 704. FIG. 7C shows the netting 765 with captured article component 703 being extended away from the gripper 704 onto the second platform 702 by a linear actuator 766. As indicated by the arrows, the linear actuator 766 extends downwards. In some embodiments, the linear actuator 766 extends downwards as the gripper 704 is moved upwards away from the article component 703 and second platform 702. In some instances, upward movement of the gripper 704 occurs in concert with downward motion of the linear actuator 766 and release of the article component 703. In some instances, the gripper 704 stays stationary above the second platform 702 while the linear actuator 766 and the netting 765 move the article component 703 down towards the second platform 702. In this case, the end of the stroke of the linear actuator 766 may be such that the article component 703 is physically resting on the second platform 702. The end of the stroke of the linear actuator 766 may alternatively be such that there is a small gap between the netting 765 and the second platform 702. In some cases, the article component 703 is placed directly on top of the second platform 702. Alternatively, the article component 703 is not placed directly on top of the second platform 702 but rather on top of one or more additional article components that have been previously placed on the second platform 702. FIG. 7D shows the gripper 704 and extended netting 765 moving away from the released article component 703. FIG. 7E shows the return of the netting 765 to the capture surface 752 of the gripper 704 by retraction of the linear actuator 766 towards the gripper 704. Retraction of the linear actuator 766 optionally comprises withdrawing the linear actuator 766 and netting 765 into the gripper 704 (e.g., into one or more orifices or indentations in the contact surface). Withdrawal of the linear actuator 766 optionally occurs prior to, simultaneously with, or after the gripper 704 moves away from the second platform 702.

In some cases, the linear actuator 766 is configured about the outer edges of the contact surface of the gripper 704 as shown. Alternatively or in combination, the linear actuator 766 is placed in the middle of the gripper 704 (e.g., in the middle of the contact surface) or at any other location as desired and will be understood by one of ordinary skill in the art.

Figure 8:
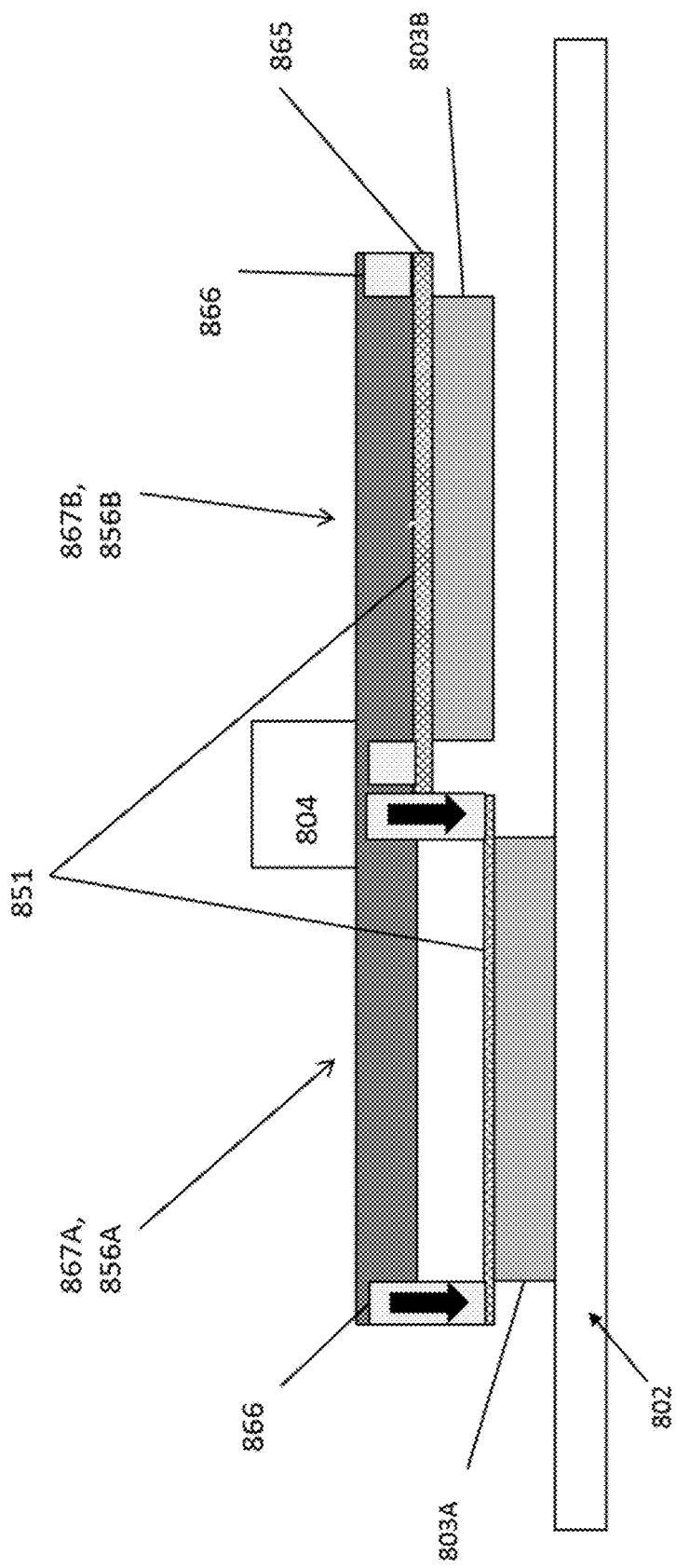
FIG. 8 shows a schematic of yet another embodiment of an electroadhesion gripper with netting wherein the electroadhesion gripper comprises multiple electroadhesion zones with netting which is individually activated to facilitate release of an article component.

FIG. 8 shows yet another embodiment of an electroadhesion gripper 804 with netting 865 wherein the electroadhesion gripper 804 comprises multiple electroadhesion zones 856 with netting 865 which are individually activated to facilitate release of a target object 803, for example an article component. Each of the first and second electroadhesion zones 856A, 856B with netting 865 is substantially similar to the electroadhesion surface 851 described in FIGS. 7A-7E. The netting 865 comprises a plurality of netting regions 867, wherein each netting region 867 is configured to be separately actuated and complementary to each separately activated electroadhesive zone 856 to facilitate release of the captured one or more target objects 803 from the electroadhesive zone 856.

Activation and/or deactivation of electroadhesion may occur prior to, simultaneously with, or after separation of the netting 865 (or netting regions 867). Activation and/or deactivation in the first electroadhesion zone 856A, or any combination of zones, may occur prior to, simultaneously with, or after the second electroadhesion zone 856B (or any other zone as in other embodiments described herein). In some instances, the voltage of the first and/or second electroadhesion zones 856A, 856B is maintained on while the netting 865 (e.g., netting regions 867) is separated from the electroadhesion gripper 804. Application of a continued attractive force on the target objects 803 may cause the target objects 803 to maintain close contact with the netting 865 without detaching and falling freely, which may improve placement accuracy in at least some instances.

Any of the gripper embodiments (comprising any of the electroadhesion surfaces) described herein may comprise any of the release mechanisms, or any combination of release mechanisms, described herein or known to one of ordinary skill in the art.

FIGS. 9A-9B show schematics of an embodiment of an electroadhesion gripper 904 comprising an electroadhesion plate 951 with a mechanical separation mechanism 970 to facilitate capture and release of an article component. The electroadhesion plate 951 may be substantially similar to other embodiments described herein.

The electroadhesion plate 951 optionally comprises a plurality of negative pressure ports thereon (not shown) to facilitate capture and release of an article component. The plurality of negative ports are configured to apply negative pressure to facilitate capture of one or more target objects, for example one or more article components. Any one or more of the plurality of negative pressure ports is further configured to apply positive pressure to facilitate release of the captured one or more target objects. The plurality of ports is coupled to one or more negative pressure sources, for example a fan, a pump, a turbine, a venturi, or any combination thereof. In some embodiments, the one or more negative pressure sources is generated on the gripper 904. The plurality of negative pressure ports for example comprises more than four negative pressure ports. Negative pressure, in combination with electroadhesion and a mechanical separation mechanism, can facilitate capture of an article component without direct contact between the article component and the electroadhesion gripper 904 for example. This hybrid approach enables the gripper to leverage electroadhesion on non-porous and/or porous article components, for example a fabric mesh, that exhibit good electron mobility, for example conductors or weakly-conductive insulators. This approach further optionally leverages vacuum to acquire article components that do not have sufficient electron mobility or do not create enough normal force to flatten deformed article components. In some embodiments, the combination of electroadhesion, vacuum, and mechanized release allows the hybrid gripper to deliver deterministic acquisition and release times across a broad range of article materials.

FIG. 9A shows a cross-section of an embodiment of an electroadhesion gripper 904 comprising a mechanical separation mechanism 970 with mechanical separation mechanism 970 retracted. The electroadhesion gripper 904 comprises a capture element 905, for example an electroadhesive plate 951 and a housing 954. The housing 954 for example extends from the electroadhesive plate 951 to the connection 971 to the robotic actuator and forms a plenum 974 therebetween. The housing 954 for example is optionally cuboid shaped, with contact between the electroadhesive plate 951 and the housing 954 forming one or more of a right angle and an obtuse angle. The housing 954 for example is curved and/or forms a right angle where the housing 954 contacts the connection 971. The housing 954 is for example optionally prismatic. As illustrated, in some embodiments the mechanical separation mechanism 970 comprises an ejector comprising ejector blades 973. When retracted as shown here, the ejector 970 is housed in the plenum 974 formed between the electroadhesion plate 951 and the housing 954 of the capture element 905. The capture element 905 is connected to the robotic actuator 906 via a linkage system 953. The electroadhesive plate 951 optionally comprises a plurality of negative pressure ports (not shown) as described herein.

FIG. 9B shows a cross-section of an embodiment of an electroadhesion gripper 904 comprising a mechanical separation mechanism 970 with mechanical separation mechanism 970 extended. Extension of the ejector blades 973 through the electroadhesion plate 951 mechanically separates the capture element 905 from a captured article component, thereby facilitating the release of said article component from the capture element 905.

Figure 9C:
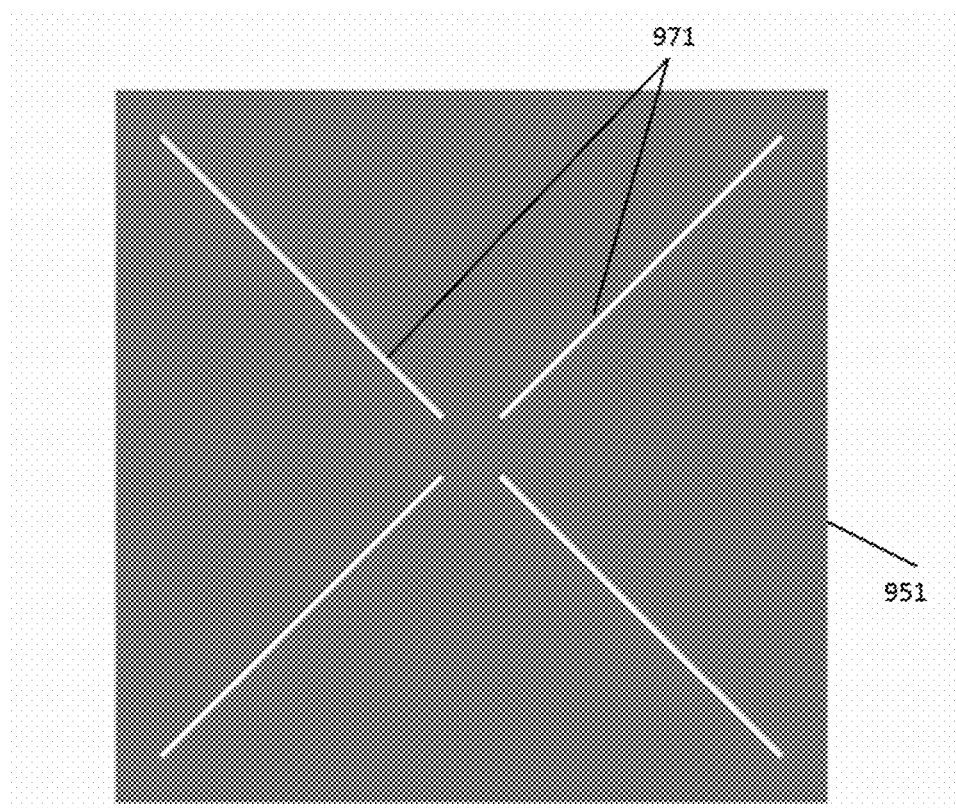
FIG. 9C shows a top view of an embodiment of an electroadhesion plate.

FIG. 9C shows a top view of the electroadhesion plate 951. In some embodiments, the electroadhesion plate 951 comprises slots 971 through which the ejector blades 973 are extended to contact the article component and facilitate release of said article component from the capture element 905.

Figure 9D:
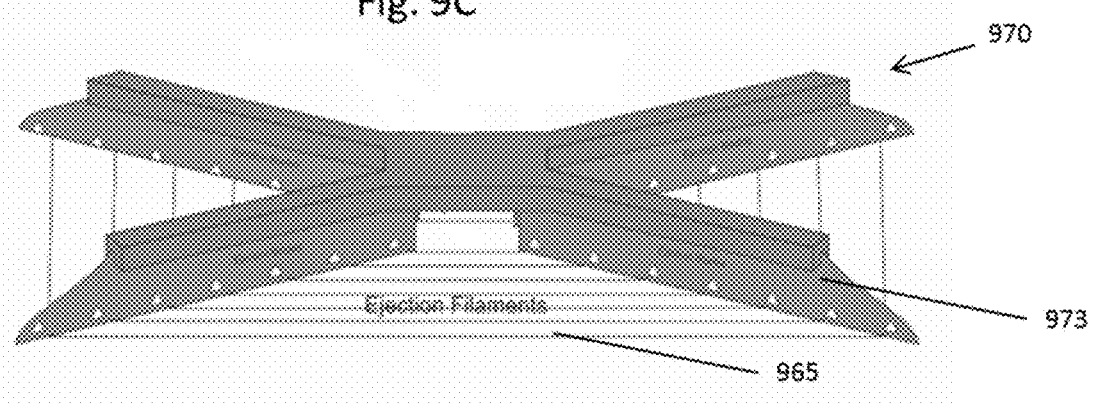
FIG. 9D shows a perspective view of an embodiment of a mechanical separation mechanism.

FIG. 9D shows a perspective view of an embodiment of a mechanical separation mechanism 970 as shown in FIG. 9A-9B. The mechanical separation mechanism 970 comprises a plurality of ejector blades 973, for example four ejector blades 973, which are arranged so as to precisely correspond with the slots 971 on the electroadhesion plate 951. The ejector blades 973 for example form a cross. In some embodiments, the ejector blades 973 are coupled for a netting or filaments 965 which are in contact with the captured article component. Actuation of the ejector blades 973 through the electroadhesion plate 951 facilitates release of the article component from the contact surface 952 of the electroadhesion plate 951.

In some embodiments, the ejection filaments 965 rest on the contact surface of the electroadhesion plate 951 when retracted. In some embodiments, the contact surface of the electroadhesion plate 951 comprises surface indentations that allow the ejection filaments 965 to be housed (e.g., inlaid) within the indentation such that the contact surface of the electroadhesion plate 951 comprises a flat surface without any offsetting due to the ejection filaments 965.

In some embodiments, the ejection filaments 965 are uniform in composition and/or density. In some embodiments, the ejection filaments 965 comprises a mix of higher density filaments in some local regions to aid in the ejection, which may be of particular use for especially sticky or tacky article components, combined with lower density filaments in other regions. In some embodiments, the surface friction coefficient of the capture element 905 may be adapted by one of ordinary skill in the art to allow easier release of the object. For example, the friction coefficient may be modified by placing additional surfaces (e.g. shaped pieces of tape or other materials) in regions of the electroadhesion plate 951 where low tackiness is desired or by localized or globalized chemical treatments of the surface to modulate surface friction.

In many embodiments, the electroadhesion gripper 904 comprises an electroadhesion plate 951 with a plurality of electroadhesion zones (as shown in FIG. 4C and described herein), each zone optionally comprising a plurality of negative pressure ports therein, as previously described herein. Each electroadhesion zone for example comprises a mechanical separation mechanism 970, for example a netting 965, such that each zone is individuated and actuatable independent of every other zone. In some embodiments, each zone is individuated in such a way that the capture and release modalities of each electroadhesion zone of the capture element 905 are activated independently from every other zone.

In some embodiments, electroadhesion and optional negative pressure in each zone are selectively controllable to facilitate capture and release of one or more article components. The plurality of ports comprises a plurality of port regions, wherein each port region is configured to be separately actuated and complementary to each individuated electroadhesive zone to facilitate selective capture or release of the one or more target objects from the electroadhesive zone. In many embodiments, the negative pressure ports in each of the port regions (or zone of ports) are connected to a vacuum supply. In some embodiments, the number of vacuum supplies matches the number of port regions, such that each port region (or port zone) is connected to a dedicated vacuum supply embedded in each port region, with each vacuum supply being individually controllable so as to control the vacuum (or negative or positive pressure) of each port zone independently of the other port zones.

In some embodiments, each electroadhesion zone 956 is separable from each other zone 956 such that the electroadhesion plate 951 has replaceable segments or zones 956. In some embodiments, each replaceable segment 956 of the electroadhesion plate 951 comprises an electroadhesion zone 956 and a housing 954 with connection to the gripper 904, such that the housing 954 and the electroadhesion zone 956 are detachable unit(s).

In many embodiments, the contact surface 952 of the electroadhesion plate 951 is non-planar. In many embodiments, the contact surface 952 of the electroadhesion plate 951 is compressible, for example being made of a compressible material. In some embodiments the contact surface 952 of the electroadhesion plate 951 is a compressible planar surface. In some embodiments, the contact surface 952 of the electroadhesion plate 951 is a compressible non-planar surface. In some embodiments, the contact surface 952 of the electroadhesion plate 951 is a non-compressible non-planar surface.

In many embodiments, the contact surface 951 of one or more of an electroadhesion zone 956 is non-planar. In many embodiments, the contact surface 951 of the electroadhesion zone 956 is compressible, for example being made of a compressible material, having a compressible coating, and/or being mounted via a compressible interface. In some embodiments the contact surface 952 of the electroadhesion zone 956 is a compressible planar surface. In some embodiments, the contact surface 952 of the electroadhesion zone 956 is a compressible non-planar surface. In some embodiments, the contact surface 952 of the electroadhesion zone 956 is a non-compressible non-planar surface. In some embodiments the plurality of electroadhesion zones 956 in the gripper are arranged so as to be coplanar. In some embodiments the plurality of electroadhesion zones 956 in the gripper are arranged so as to be not coplanar—for example specifically arranged so as to improve gripping force and article flatness following release onto the second platform.

Figure 10C:
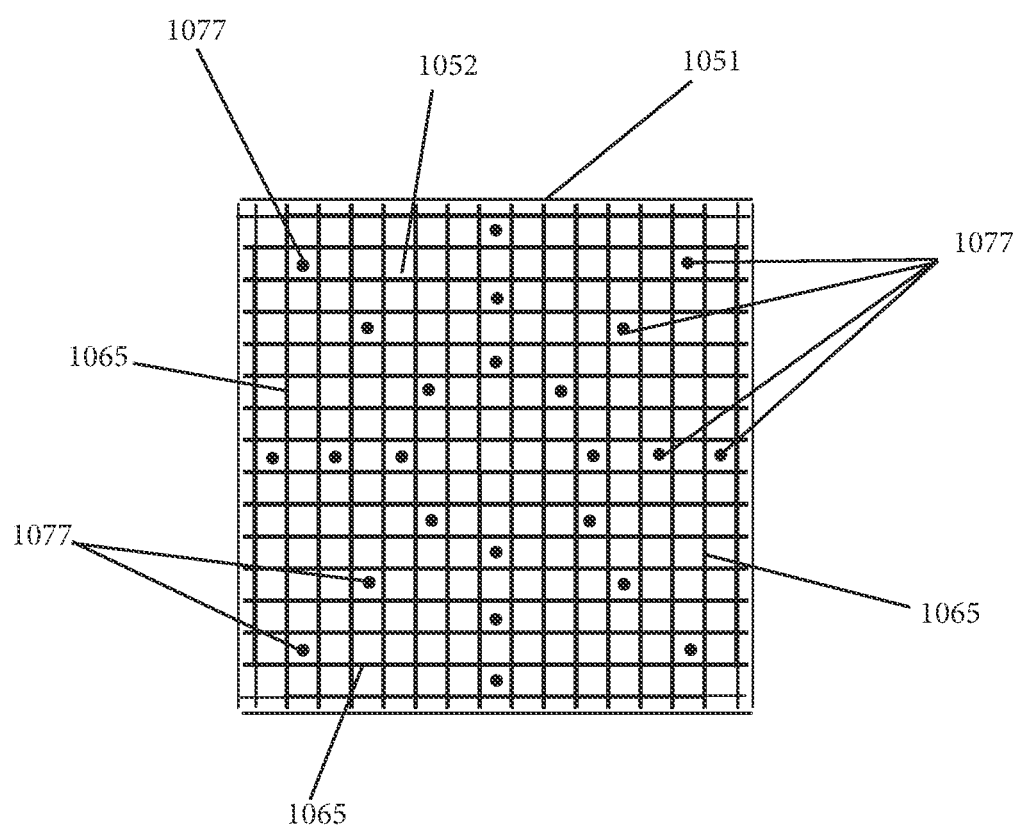
FIG. 10C is a bottom plan view of an alternative electroadhesion gripper comprising pins and netting.

FIGS. 10A-10B illustrate an embodiment of an electroadhesion gripper 1004 comprising pins 1077 to aid in release of an article component 1003 from the electroadhesion gripper 1004. The electroadhesion gripper 1004 comprises a capture element, for example an electroadhesive surface 1051. The gripper 1004 optionally further comprises an array of pins 1078 extendable from the contact surface 1052 of the electroadhesion gripper 1004 to facilitate release of one or more captured target object 1003, for example an article component. In many embodiments, the plurality of pins 1077 comprises a plurality of pin regions 1079, wherein each pin region 1079 is configured to separately actuated and complementary to each separately activated electroadhesive zone 1056 to facilitate release of the captured one or more captured target objects 1003. FIG. 10A shows an embodiment of electroadhesion gripper zone 1056 with captured article component 1003 and an array of retracted pins 1078. The electroadhesive surface 1051 comprises an array of holes 1080 through which the array of pins 1078 is actuated. FIG. 10B shows the release of the article component 1003 by actuation of the pins 1077 through the electroadhesion gripper plate 1051 towards the second platform 1002. FIG. 10C shows an electroadhesive gripper comprising both pins 1077 and a netting 1065, where netting 1065 is disposed over contact surface 1052 of the electroadhesive surface 1051 and pins 1077 are extendable from contact surface 1052.

In some instances, the pins 1077 project from the electroadhesive surface 1051 such that the tip of each pin 1077 contacting the article component 1003 is in plane with every other pin 1077 and equidistant from the electroadhesive surface 1051. In some instances, the pins 1077 project from the electroadhesive surface in a non-uniform, patterned, shaped, or otherwise varied manner in order to facilitate release of the article component 1003 (for example to cause "peeling" of the article component 1003 from the surface 1051). For example, the array of pins 1078 can be shaped, or the pin array 1078 may be attached to the gripper 1004, in such a way so as to provide varied actuation of the pins 1077 through the surface 1051.

In some embodiments, the actuation modalities are integrated and packaged as at least one of a switchable or replaceable assembly. For example, in some embodiments the actuators are switchable and the composition of the zone actuators is configured during machine operation to enable special capability to accomplish specific application functionality. For example, in some embodiments the actuators are replaceable such that the replaceable assembly is used as a consumable that is switched out by the operator when the consumable's useful design-life has been reached. The consumable is, for example, discharged from the gripper onto the first platform, for example a turntable, and fed back to the operator. The operator in turn feeds a replacement consumable onto the turntable for delivery to the robot-side and attachment to the gripper. Attachment and detachment of the consumable is accomplished automatically.

FIG. 11 shows a method 1100 of capturing and releasing a plurality of target objects using an electroadhesion manufacturing system comprising an electroadhesion gripper as described previously herein. The method may use one or more of the systems and apparatus described herein.

At step 1101, the first article component is captured by a first electroadhesion zone and the second article component is capture by a second electroadhesion zone. Capture of the first article component for example comprises activation of electroadhesion within the first electroadhesion zone (step 1101A). Capture of the second article component for example comprises one or more of activation of electroadhesion within the second electroadhesion zone (step 1101A) and application of negative pressure at the second electroadhesion zone (step 1101B). Capture of the first and second article components occurs simultaneously.

At step 1102, the first article component is released from the first electroadhesion zone while the second article component is retained at the second electroadhesion zone. Release of the first article component from the first electroadhesion zone for example comprises one or more of reversal of the electrode voltage of the first electroadhesion zone (step 1102A), separation of a netting from the first electroadhesion zone (step 1102B), extension of pins from the first electroadhesion zone (step 1102C), cessation of negative pressure at the first electroadhesion zone (step 1102D), and application of positive pressure the first electroadhesion zone (step 1102E).

At step 1103, the second article component is released from the second electroadhesion zone. Release of the second article component from the second electroadhesion zone for example comprises any one or more of the release mechanisms described previously herein.

At step 1104, the previous steps are repeated for multiple article components.

Although the steps above show a method 1100 of capturing and releasing a plurality of target objects using an electroadhesion manufacturing system comprising an electroadhesion gripper in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as necessary to assemble at least a part of an article.

For example, Step 1101 optionally occurs such that the first and second article components are captured at different times. In many embodiments, additional article components are for example captured simultaneously with the capture of the first and second article components, respectively.

Although the steps above show a method 1100 of capturing and releasing objects in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as beneficial.

In many embodiments, one or more of the steps of the method 1100 are performed with circuitry of the various components described herein. In some embodiments, the circuitry is programmed to provide one or more of the steps of the method 1100, and the program comprises program instructions stored on a computer readable memory or programmed steps of the logic in the circuitry.

FIG. 12 shows a method 1200 of manufacturing an article using an electroadhesion manufacturing system comprising an electroadhesion gripper as described previously herein. The method may use one or more of the systems and apparatus described herein.

At step 1201, the capture element is placed over the first article component. Placement of the capture element for example comprises one or more of moving a robotic arm (step 1201A) and aligning the capture element to a first predetermined capture location (step 1201B).

At step 1202, the first article component is captured by the first electroadhesion zone. Capture for example comprises one or more of activation of electroadhesion within the first electroadhesion zone (step 1202A) and application of negative pressure at the first electroadhesion zone (step 1202B). For example, the application of electroadhesion, negative pressure, or the combination thereof is selected based on the type of article component being handled.

At step 1203, the capture element is placed over the second article component. Placement of the capture element for example comprises one or more of moving the robotic arm (step 1203A) and aligning the capture element to a second predetermined capture location (step 1203B).

At step 1204, the second article component is captured by the second electroadhesion zone. Capture for example comprises one or more of activation of electroadhesion within the second electroadhesion zone (step 1204A) and application of negative pressure at the second electroadhesion zone (step 1204B).

At step 1205, the article components are moved to a position over the second platform. Movement of the article components for example comprises one or more of moving the robotic arm (step 1205A) and aligning the capture element to the first predetermined release location (step 1205B).

At step 1206, the first article component is released from the first electroadhesion zone while the second article component is retained at the second electroadhesion zone. Release of the first article component from the first electroadhesion zone for example comprises one or more of reversal of the electrode voltage of the first electroadhesion zone (step 1206A), separation of a netting from the first electroadhesion zone (step 1206B), extension of pins from the first electroadhesion zone (step 1206C), cessation of negative pressure at the first electroadhesion zone (step 1206D), and application of positive pressure the first electroadhesion zone (step 1206E).

At step 1207, the second article component is released onto the second platform. Release of the second article component from the second electroadhesion zone for example optionally comprises moving the robotic arm to align the capture element with a second predetermined release location of the second platform as previously described herein. Release of the second article component from the second electroadhesion zone for example comprises any one or more of the release mechanisms described previously herein.

At step 1208, the previously described steps are repeated for multiple article components.

Although the steps above show a method of manufacturing an article using an electroadhesion manufacturing system comprising an electroadhesion gripper in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as necessary to assemble at least a part of an article.

Alternatively or in combination, Steps 1801 and 1805 of positioning the capture element optionally occur simultaneously when the first and second article components have been placed in predetermined capture locations such that Steps 1802 and 1804 are able to be performed simultaneously to capture the first and second article components at the same time. In many embodiments, additional article components are for example captured simultaneously with the capture of the first and second article components, respectively.

Although the steps above show a method 1800 of manufacturing an article in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as beneficial.

In many embodiments, one or more of the steps of the method 1800 are performed with circuitry of the various components described herein. In some embodiments, the circuitry is programmed to provide one or more of the steps of the method 1800, and the program comprises program instructions stored on a computer readable memory or programmed steps of the logic in the circuitry.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. The process steps described herein may be conducted in sequence, out of sequence, or combined with one another. It is intended that the following claims define the scope of the invention and that methods and structures within the scope of these claims and their equivalents be covered thereby.

What is claimed is:

1. An electroadhesive apparatus comprising: an electroadhesive plate having a contact surface for capturing one or more target objects with electroadhesion, the electroadhesive plate comprising a mechanical separation mechanism; and a controller configured to individually activate or deactivate electroadhesion of the electroadhesive plate, wherein the controller is configured to actuate the mechanical separation mechanism independent of activation or deactivation of electroadhesion, wherein the mechanical separation mechanism comprises a netting configured to be placed over the contact surface to facilitate release of the one or more captured target objects.

2. The apparatus of claim 1, wherein the electroadhesive plate comprises a plurality of electroadhesive zones, wherein electroadhesion in each electroadhesive zone is separately activated, and wherein the controller is configured to individually activate or deactivate electroadhesion in each of the plurality of electroadhesive zones.

3. The apparatus of claim 2, wherein the controller is coupled to each of the electroadhesive zones to individually activate electroadhesion in each of the electroadhesive zones.

4. The apparatus of claim 2, wherein the netting comprises a plurality of netting regions, wherein each netting region is configured to be separately actuated and complementary to each separately activated electroadhesive zone to facilitate release of the captured one or more target objects from the electroadhesive zone.

5. The apparatus of claim 4, wherein the plurality of netting regions comprises a first netting region and a second netting region, the first netting region having a higher density netting than the second netting region.

6. The apparatus of claim 2, further comprising an array of pins extendable from the contact surface to facilitate release of the one or more captured target objects, and wherein the plurality of pins comprises a plurality of pin regions, wherein each pin region is configured to be separately actuated and complementary to each separately activated electroadhesive zone to facilitate release of the captured one or more target objects from the electroadhesive zone.

7. The apparatus of claim 1, further comprising a robotic actuator coupled to the electroadhesive plate to move the electroadhesive plate to capture or release the one or more target objects.

8. The apparatus of claim 1, wherein the netting is configured to separate from the contact surface to facilitate release of the one or more captured target objects.

9. The apparatus of claim 1, wherein at least a portion of the netting is inlaid into the contact surface.

10. The apparatus of claim 1, further comprising a linear actuator coupled to the electroadhesive plate and the netting to separate the netting and the contact surface from one another to facilitate release of the one or more captured target objects.

11. The apparatus of claim 1, wherein electroadhesion remains activated while the netting is separated from the contact surface.

12. The apparatus of claim 1, wherein electroadhesion is deactivated while the netting is separated from the contact surface.

13. The apparatus of claim 1, further comprising an array of pins extendable from the contact surface to facilitate release of the one or more captured target objects.

14. A method of capturing and releasing a plurality of target objects, the method comprising: capturing a first target object with an electroadhesive plate; capturing a second target object with the electroadhesive plate; releasing the first target object from the electroadhesive plate; and releasing the second target object from the electroadhesive plate, wherein one or more of releasing the first and second target objects comprises mechanically separating the one or more of the first and second target objects from a contact surface of the electroadhesive plate, and wherein mechanically separating the one or more of the first and second target objects comprises separating a netting from the contact surface of the electroadhesive plate.

15. The method of claim 14, wherein capturing the first target object comprises capturing the first target object with a first electroadhesive zone of the electroadhesive plate, wherein capturing the second target object comprises capturing the second target object with a second electroadhesive zone of the electroadhesive plate, wherein the first and second electroadhesive zones are in separate positions, wherein releasing the first target object comprises releasing the first target object from the first electroadhesive zone while the second target object remains captured by the second electroadhesive zone, and wherein releasing the second target object comprises releasing the second target object from the second electroadhesive zone.

16. The method of claim 14, further comprising applying negative pressure to facilitate capture of one or more of the first and second target objects.

17. The method of claim 14, wherein mechanically separating the first and second target objects further comprises extending a plurality of pins from a contact surface of the electroadhesive plate to separate the contact surface from the captured first or second target objects.

18. The method of claim 14, wherein at least the first and second target objects are assembled into an article, and wherein one or more of the first and second target objects comprises a textile piece, a shoe part, an automotive part, a machinery part, or a circuitry part, and wherein the article comprises, respectively, at least a portion of an article of clothing, at least a portion of a shoe, at least a portion of a machine, or at least a portion of a circuit.

19. An electroadhesive apparatus comprising:
an electroadhesive plate having a contact surface for capturing one or more target objects with electroadhesion, the electroadhesive plate comprising a mechanical separation mechanism;
a robotic actuator coupled to the electroadhesive plate to move the electroadhesive plate to capture or release the one or more target objects; and
a controller configured to individually activate or deactivate electroadhesion of the electroadhesive plate, wherein the controller is configured to actuate the mechanical separation mechanism independent of activation or deactivation of electroadhesion,
wherein the mechanical separation mechanism comprises a netting configured to be placed over the contact surface to facilitate release of the one or more captured target objects, and wherein the netting is configured to separate from the contact surface to facilitate release of the one or more captured target objects.

20. The apparatus of claim 19, wherein the electroadhesive plate comprises a plurality of electroadhesive zones, wherein electroadhesion in each electroadhesive zone is separately activated, and wherein the controller is configured to individually activate or deactivate electroadhesion in each of the plurality of electroadhesive zones, and wherein the netting comprises a plurality of netting regions, wherein each netting region is configured to be separately actuated and complementary to each separately activated electroadhesive zone to facilitate release of the captured one or more target objects from the electroadhesive zone.

* * * * *